US010832156B2

(12) United States Patent
Chen et al.

(10) Patent No.: US 10,832,156 B2
(45) Date of Patent: Nov. 10, 2020

(54) COUPLING ARCHITECTURES FOR SUPERCONDUCTING FLUX QUBITS

(71) Applicant: Google LLC, Mountain View, CA (US)

(72) Inventors: Yu Chen, Goleta, CA (US); Hartmut Neven, Malibu, CA (US); Austin Greig Fowler, Reseda, CA (US); Alireza Shabani Barzegar, Los Angeles, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 16/096,110

(22) PCT Filed: Dec. 30, 2016

(86) PCT No.: PCT/US2016/069382
§ 371 (c)(1),
(2) Date: Oct. 24, 2018

(87) PCT Pub. No.: WO2017/189053
PCT Pub. Date: Nov. 2, 2017

(65) Prior Publication Data
US 2019/0147359 A1 May 16, 2019

Related U.S. Application Data

(60) Provisional application No. 62/327,356, filed on Apr. 25, 2016.

(51) Int. Cl.
*G06N 10/00* (2019.01)
*H01L 39/02* (2006.01)
(Continued)

(52) U.S. Cl.
CPC .......... *G06N 10/00* (2019.01); *H01L 39/025* (2013.01); *H01P 3/003* (2013.01); *H01P 7/086* (2013.01)

(58) Field of Classification Search
CPC ....... G06N 10/00; H01L 39/025; H01P 3/003; H01P 7/086
See application file for complete search history.

(56) References Cited

U.S. PATENT DOCUMENTS 7,230,266 B2 * 6/2007 Hilton ................... B82Y 10/00
257/31
7,932,514 B2 * 4/2011 Farinelli ................ G06N 10/00
257/31

(Continued)

OTHER PUBLICATIONS

Palacios-Laloy et al. "Tunable resonators for quantum circuits," arXiv 0712.0221, Dec. 3, 2007, 8 pages.

(Continued)

*Primary Examiner* — Yasser A Abdelaziez
(74) *Attorney, Agent, or Firm* — Fish & Richardson P.C.

(57) ABSTRACT

A quantum computing device includes: a first array of qubits arranged along a first axis; and a second array of qubits arranged along a second axis different from the first axis so that the qubits of the second array intersect with the qubits of the first array to form a lattice structure, in which each qubit in the first array is offset along the second axis relative to a directly adjacent qubit in the first array, each qubit in the second array is offset along the first axis relative to a directly adjacent qubit in the second array, and each intersection between a qubit from the first array and a qubit from the second array in the lattice structure comprises a coupler arranged to inductively couple the qubit from the first array to the qubit from the second array.

19 Claims, 15 Drawing Sheets

(51) Int. Cl.
*H01P 3/00* (2006.01)
*H01P 7/08* (2006.01)

(56) References Cited

U.S. PATENT DOCUMENTS

| | | | |
|---|---|---|---|
| 9,219,298 B2* | 12/2015 | Abraham | H01P 7/086 |
| 2014/0097405 A1 | 4/2014 | Bunyk | |
| 2017/0091647 A1* | 3/2017 | Abdo | G01R 23/02 |
| 2017/0148972 A1* | 5/2017 | Thompson | H01P 11/003 |

OTHER PUBLICATIONS

PCT International Preliminary Report on Patentability issued in International Application No. PCT/US2016/069382, dated Jul. 2, 2018, 8 pages.
PCT International Search Report and Written Opinion issued in International Application No. PCT/US2016/069382, dated May 29, 2017, 17 pages.
Yan et al. "The flux quibit revisited to enhance coherence and reproducibility," Aug. 25, 2015, arXiv 1508.06299, 53 pages.
CA Office Action in Canadian Application No. 3,022,039, dated Jul. 30, 2019, 4 pages.
EP Communication pursuant to Article 94(3) EPC in European Appln No. 16831806.1, dated Feb. 7, 2020, 6 pages.

* cited by examiner

COUPLING ARCHITECTURES FOR SUPERCONDUCTING FLUX QUBITS

CROSS-REFERENCE TO RELATED APPLICATIONS

This application is a national stage application of PCT application No. PCT/US2016/069382, filed on Dec. 30, 2016, which, in turn, claims the benefit of U.S. Provisional Application No. 62/327,356, filed on Apr. 25, 2016, each of which is hereby incorporated by reference in its entirety.

TECHNICAL FIELD

The present disclosure relates to coupling architectures for superconducting flux qubits.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

Quantum annealing is an analog approach to quantum computation. With quantum annealing, also known as adiabatic quantum computing, an initial Hamiltonian $H_0$ is encoded in interactions among multiple qubits. The collection of encoded qubits then is slowly annealed to the lowest energy configuration of a final problem Hamiltonian $H_f$. This lowest energy configuration is representative of a solution to the encoded problem. This model can sometimes be referred to as the adiabatic model of quantum computation.

SUMMARY

In general, in some aspects, the subject matter of the present disclosure can be embodied in quantum computing devices that include: a first array of qubits arranged along a first axis; and a second array of qubits arranged along a second axis different from the first axis so that the qubits of the second array intersect with the qubits of the first array to form a lattice structure, in which each qubit in the first array is offset along the second axis relative to a directly adjacent qubit in the first array, each qubit in the second array is offset along the first axis relative to a directly adjacent qubit in the second array, and each intersection between a qubit from the first array and a qubit from the second array in the lattice structure comprises a coupler arranged to inductively couple the qubit from the first array to the qubit from the second array.

Implementations of the quantum computing devices can include one or more of the following features. For example, in some implementations, each qubit of the lattice structure includes a co-planar waveguide electrically coupled to a superconducting quantum interference device (SQUID).

In some implementations, the first array includes N qubits, the second array includes N qubits, with N being greater than or equal to 2, each qubit in the first array is offset along the second axis relative to a directly adjacent qubit in the first array by a first distance that is approximately equal to √N evenly spaced qubits oriented in the same direction, and each qubit in the second array is offset along the first axis relative to a directly adjacent qubit in the second array by the first distance.

In some implementations, the first axis is orthogonal relative to the second axis.

In some implementations, each intersection between a qubit from the first array and a qubit from the second array in the lattice structure includes two couplers arranged to inductively couple the qubit from the first array to the qubit from the second array.

In some implementations, the coupler at each intersection between a qubit from the first array and a qubit from the second array is arranged to inductively couple a co-planar waveguide of the qubit from the first array to a co-planar waveguide of the qubit from the second array.

In some implementations, the unit cell is arranged to provide c-way coupling, and c is greater than or equal to 2.

In some implementations, the quantum computing device further includes a third array of qubits arranged along a third axis different from the first axis and the second axis, so that the qubits of the third array intersect with the qubits of the first array and the second array to form the lattice structure.

In some implementations, a first qubit in the first array is offset along the second axis relative to a directly adjacent second qubit in the first array by a first amount, and a third qubit in the first array is offset along the second axis relative to a directly adjacent fourth qubit in the first array by a second amount that is different from the first amount.

In general, in some aspects, the subject matter of the present disclosure can be embodied in quantum computing devices having multiple unit cells in which each unit cell of the plurality of unit cells includes: a first array of qubits arranged along a first axis; and a second array of qubits arranged along a second axis different from the first axis so that the qubits of the second array intersect with the qubits of the first array to form a lattice structure, in which each qubit in the first array is offset along the second axis relative to a directly adjacent qubit in the first array, each qubit in the second array is offset along the first axis relative to a directly adjacent qubit in the second array, and each intersection between a qubit from the first array and a qubit from the second array in the lattice structure comprises a coupler arranged to inductively couple the qubit from the first array to the qubit from the second array. The multiple unit cells are tiled such that each unit cell of the plurality of unit cells is operatively coupled to its neighboring unit cells.

Implementations of the quantum computing devices can have one or more of the following features. For example, in some implementations, each qubit of each unit cell includes a co-planar waveguide electrically coupled to a superconducting quantum interference device (SQUID).

In some implementations, for each unit cell of the multiple unit cells, the first array of the unit cell comprises N qubits, the second array of the unit cell comprises N qubits, N is greater than or equal to 2, each qubit in the first array of the unit cell is offset along the second axis relative to a directly adjacent qubit in the first array by a first distance that is approximately equal to √N evenly spaced qubits oriented in the same direction, and each qubit in the second array of the unit cell is offset along the first axis relative to a directly adjacent qubit in the second array by the first distance.

In some implementations, for each unit cell of the multiple unit cells, the first axis is orthogonal relative to the second axis.

In some implementations, for each unit cell of the multiple unit cells, each intersection between a qubit from the first array and a qubit from the second array in the lattice structure includes two couplers arranged to inductively couple the qubit from the first array to the qubit from the second array.

In some implementations, for each unit cell of the multiple unit cells, the coupler at each intersection between a qubit from the first array and a qubit from the second array is arranged to inductively couple a co-planar waveguide of the qubit from the first array to a co-planar waveguide of the qubit from the second array.

In some implementations, the multiple unit cells are tiled such that, for each unit cell of the multiple unit cells, at least one co-planar waveguide from a qubit of the unit cell is coupled to at least one other co-planar waveguide from a qubit of a different unit cell. For example, for each unit cell of the multiple unit cells, each co-planar waveguide from each qubit of the unit cell is coupled to at least one other co-planar waveguide from a qubit of a different unit cell.

In some implementations, the tiles are arranged along a grid of U rows and U columns, and U is greater than or equal to 2.

In some implementations, the grid has a diameter of 2U.

In some implementations, each unit cell of the multiple unit cells is arranged to provide c-way coupling, and c is greater than or equal to 2.

In some implementations, the multiple unit cells include approximately $2U^2c$ qubits.

In some implementations, the quantum computing device includes a resonator, in which a first end of the resonator is coupled to a first qubit and a second end of the resonator is coupled to a second qubit different from the first qubit.

In general, in another aspect, the subject matter of the present disclosure can be embodied in quantum computing devices that include: multiple qubits; at least one coupler, each coupler positioned adjacent to a corresponding pair of qubits of the multiple qubits, such that one qubit in the pair of qubits is operatively coupled to the other qubit in the pair of qubits; and a resonator, in which a first portion of the resonator is positioned near a first qubit of the plurality of qubits so as to operatively couple to the first qubit, and a second portion of the resonator is positioned near a second qubit of the plurality of qubits so as to operatively couple to the second qubit.

Implementations of the quantum computing devices can have one or more of the following features. For example, in some implementations, the multiple qubits, the at least one coupler, and the resonator are collectively capable of being in any one of at least two configurations, the at least two configurations including a first configuration characterized by an initial Hamiltonian $H_0$, and a second configuration characterized by a problem Hamiltonian $H_P$, the problem Hamiltonian having a ground state, in which each respective qubit in the multiple qubits and a corresponding other qubit in the multiple qubits define an associated qubit-to-qubit coupling strength, the first qubit and the resonator define a first qubit-to-resonator coupling strength, the second qubit and the resonator define a second qubit-to-resonator coupling strength, and in which the qubit-to-qubit coupling strength between each respective qubit and corresponding other qubit, the first qubit-to-resonator coupling strength, and the second qubit-to-resonator coupling strength collectively define a computational problem to be solved.

In some implementations, the multiple qubits include multiple superconducting co-planar waveguide flux qubits, multiple loopy flux qubits, or multiple charge qubits.

In some implementations, the first portion of the resonator includes a first end of the resonator, the second portion includes a second end of the resonator, and the second end is opposite to the first end.

In some implementations, a third portion of the resonator is positioned near a third qubit of the multiple qubits so as to operatively couple to the third qubit and to define an effective first-to-second-to-third qubit coupling strength.

In some implementations, a frequency of the resonator is approximately equal to a frequency of the first qubit and/or of the second qubit.

In some implementations, the resonator has a length between about 1000 m to about 15000 μm.

The foregoing and other implementations can have one or more of the following advantages. For example, in some implementations, the architectures disclosed herein provide an increase in qubit density. With higher qubit density, a greater range and complexity of problems may be represented and solved. In some implementations, the increase in qubit density can be achieved using a smaller amount of hardware (e.g., couplers) between qubits compared to what would be required with other coupling architectures that achieve the same or less qubit density. With less hardware between qubits, the quantum system can be considered to be less "stiff," i.e., it is easier to transition between different quantum states and there is a lower probability of getting trapped in an undesired state. In some implementations, the increase in density can be achieved by evenly spacing apart the qubits within the coupling architecture. By evenly spacing the qubits, the crosstalk between different qubits is more symmetrical, thus simplifying the calculation and compensation of crosstalk in the system. With reduced computational requirements for calculating and compensating crosstalk, a higher magnitude of crosstalk between can be accommodated, allowing the qubits to be placed closer together. In some implementations, the coupling architectures disclosed herein provide greater interconnectedness between qubits, thus enabling a potentially more computationally powerful quantum computer.

The details of one or more embodiments are set forth in the accompanying drawings and the description below. Other features and advantages will be apparent from the description, drawings, and the claims.

DETAILED DESCRIPTION

Figure 1A:
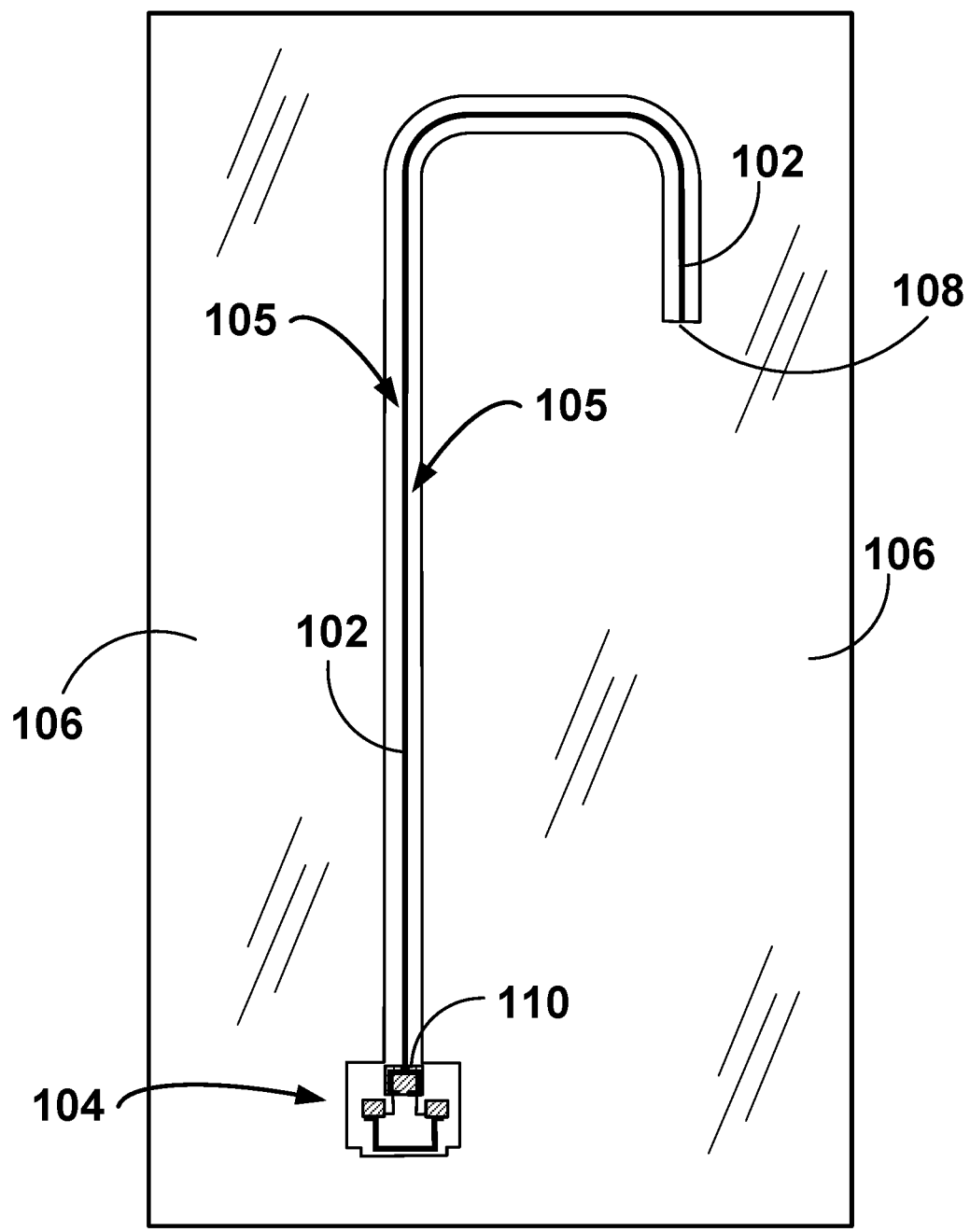
FIG. 1A is a schematic illustrating a top view of an example of a co-planar waveguide flux qubit.

In an adiabatic quantum computing device, also referred to as a quantum annealer, the qubits of the annealer are operatively coupled together in a controllable manner within a coupling architecture, such that the quantum state of each qubit affects the corresponding quantum states of the qubits to which it is coupled.

Various parameters can be used to characterize the benefits and/or advantages of a particular qubit coupling architecture. Examples of such qubit coupling architecture parameters include the number of coupled qubits, the graph diameter, the graph treewidth, and graph conductance, and spin glass transition temperature. In certain implementations, the computing power of a quantum annealer can be significantly improved by increasing the number of other qubits to which each qubit couples within the qubit coupling architecture. In general, graph diameter can be understood to be the maximum eccentricity of any vertex in the graph. To find the diameter of a graph, the shortest path is determined between each pair of vertices, such that the greatest length of any of these paths corresponds to the diameter of the graph. With respect to qubit coupling architectures, each qubit within the architecture corresponds to a vertex of the graph, such that the diameter of the coupling architecture can be expressed as the maximum eccentricity of any qubit in the architecture. A smaller diameter suggests a shorter path from the initial state of the system to any state which may correspond to the global optimum, or best solution. For qubit coupling architectures, graph treewidth can be understood to be a measure of the interconnectedness among qubits within the architecture. A large treewidth suggests increased interconnectedness among the qubits and, as a result, a computationally powerful architecture that has the ability to solve (or at least solve more efficiently) problems with higher complexity than those that can be solved by graphs having a smaller treewidth or by classical computing architectures. Graph conductance can be understood as a measure of a lack of bottlenecks within the graph. For example, in some instances, the coupling architecture requires a relatively high number of couplers that must be traversed between qubits, which can increase the stiffness of the system. That is, it becomes more difficult in the selected system to transition between different quantum states. A larger conductance therefore suggests fewer bottlenecks, and an easier transition between quantum states. In the context of qubit coupling architectures, spin glass transition temperature is an indicator of how hard of a problem can be represented by the coupling graph. Thus, architectures having higher spin glass transition temperatures can be capable of solving more difficult problems.

In general, in some aspects, the subject matter of the present disclosure is directed to quantum annealers employing architectures for coupling qubits in which the coupling architectures provide, in certain implementations, an increase in qubit coupling, low graph diameters, large treewidths, high conductance, high spin glass transition temperatures and/or a reduction in the amount of quantum hardware required to implement the architecture. Moreover, in some implementations, the processor architecture disclosed herein provides a highly flexible and basic design that can be easily extended as more qubits are added to the system.

Co-Planar Waveguide Flux Qubit

The architectures disclosed herein rely on the use of qubits that, due to their structure, can provide a higher number of tunable interactions with other similar qubits relative to other qubit types, such as the persistent current flux qubit. An example of a qubit that can provide a greater number of tunable interactions is the co-planar waveguide flux qubit. Before providing a description of the quantum processor architectures, an overview of a co-planar waveguide flux qubit and how qubit coupling can be performed is provided with respect to FIGS. 1A-1C and FIG. 2. FIG. 1A is a schematic illustrating a top view of an example of a co-planar waveguide flux qubit 100. Qubit 100 includes a co-planar waveguide 102 that is coupled to a quantum device 104. The quantum device 104 can include, but is not limited to, superconducting quantum interference devices (SQUIDS). In the present example, the quantum device 104 is a DC-superconducting quantum interference device (DC-SQUID), though other SQUID devices may be used. The co-planar waveguide 102 and DC-SQUID 104 are surrounded by and are in electrical contact with a ground plane 106. Each of waveguide 102, DC-SQUID 104 and ground plane 106 is formed from a superconducting thin film material using standard thin film fabrication processes on a dielectric substrate (e.g., sapphire or $SiO_2$, or a semiconductor such as Si).

Waveguide 102 is arranged on the substrate as an elongated thin film, in which one end 108 of the thin film is in electrical contact with the ground plane 106 and another opposite end 110 of the thin film is in electrical contact with DC-SQUID 104. In other implementations, both ends of the waveguide 102 are in electrical contact with the ground plane 106 and the quantum device 104 is electrically coupled between the ends of the waveguide (e.g., at or near a midpoint of the waveguide 102). The elongated sides of the waveguide 102 are separated from the ground-plane 106 by corresponding and co-extensive gaps 105. In the present example, the width of each respective gap 105 is constant along the length of the elongated waveguide, e.g., to avoid unnecessary reflection of the electromagnetic wave. The desired mode profile of a waveguide is the symmetric co-planar waveguide (CPW) mode, with the two ground planes on either side of the center trace held to the same voltage. In some implementations, the waveguide 102 may have a length (measured along the elongated sides) of up to about several thousands of micrometers or more, and a width (as measured transverse to the length) of up to about several tens of micrometers. The thickness of the deposited film (or films) forming the waveguide 102 (as well as the ground plane 106 and portions of the DC-SQUID) may be between tens and thousands of nanometers, e.g., on the order of 100 to 200 nm.

Figure 1B:
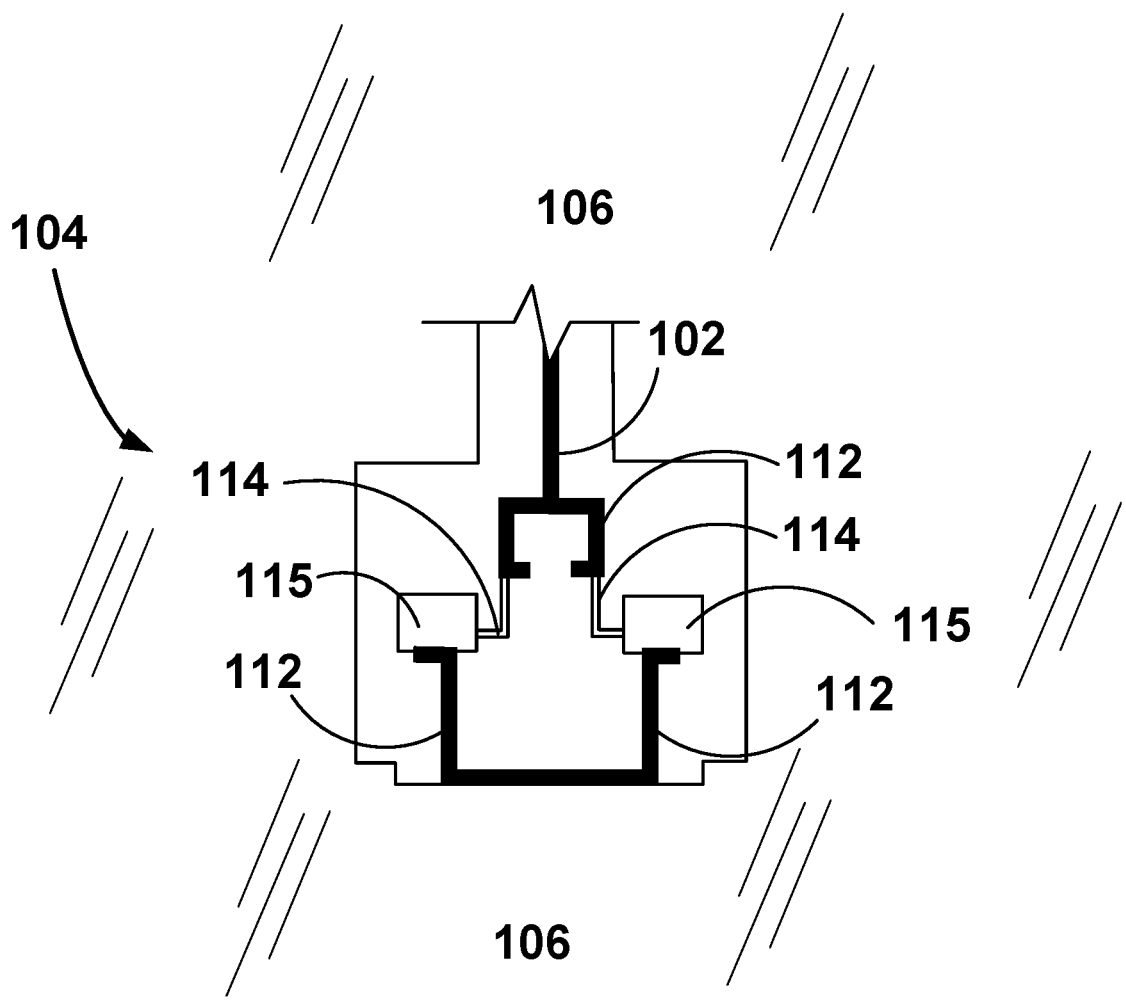
FIG. 1B is a schematic illustrating a close-up view of an example Superconducting Quantum Interference Device (SQUID) used in the co-planar waveguide flux qubit from FIG. 1A.

In some implementations, the end 108 of the waveguide 102 has a bend or hook shape so as to provide a region for inductively coupling the qubit to a readout device (not shown) or for inductive coupling to the waveguide of another qubit. FIG. 1B is a schematic illustrating a close-up view of DC-SQUID 104 coupled to waveguide 102. DC-SQUID 104 includes a loop 112 of superconducting material that is interrupted by two Josephson junctions 114, each of which can be formed from a thin-film non-superconducting/insulating material. For example, the Josephson junctions 114 may be formed from a tri-layer of $Al/Al_2O_3/Al$ thin films. Thus, the Josephson junctions 114 are coupled in parallel with one another, with a first common node in electrical contact with the waveguide 102 and a second common node in electrical contact with the ground plane 106. The Josephson junctions 114 are electrically connected to the loop 112 through contact pads 115 that may be formed from the same or different superconducting material as the loop 112. In some implementations, the contact pads 115 are absent and the Josephson junctions 114 are in direct physical and electrical contact with the loop 112. The thickness of the loop 112, contact pads 115 and Josephson junctions may be between tens and thousands of nanometers, e.g., on the order of 100 to 200 nm. Each of waveguide 102, DC-SQUID 104, and ground-plane 106 may be formed from materials exhibiting superconducting properties at or below a superconducting critical temperature, such as aluminum (superconducting critical temperature of 1.2 kelvin) or niobium (superconducting critical temperature of 9.3 kelvin). The substrate on which the waveguide 102, DC-SQUID 104 and ground-plane 106 are formed includes a dielectric material such as, e.g., sapphire, $SiO_2$ or Si. In some implementations, sapphire provides an advantage of low dielectric loss, thus leading to higher decoherence times.

Figure 1C:
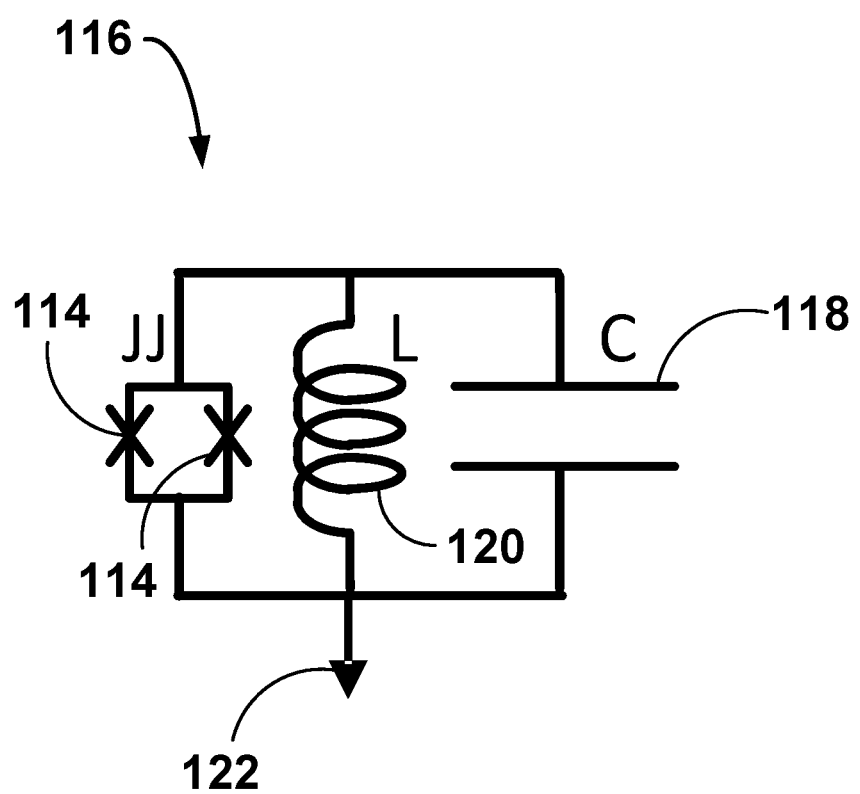
FIG. 1C is a schematic illustrating a circuit diagram representative of the co-planar waveguide flux qubit of FIG. 1A.

Co-planar waveguide flux qubit 100 may operate, in some implementations, in a similar manner to a persistent current flux qubit. That is, when a magnetic flux is introduced to the co-planar waveguide, two persistent current states may be generated that circulate in the co-planar waveguide loop in opposite directions. Such magnetic fluxes may be introduced by, e.g., an on-chip flux bias line. The flux bias line can be a thin film superconductor and can inductively couple to the co-planar waveguide when the flux bias line is activated by providing the bias line with current. The waveguide 102 also serves as a resonator through which strong and long range coupling to other qubits may be achieved. FIG. 1C is a schematic illustrating a circuit diagram 116 representative of qubit 100. As shown in the circuit diagram 116, qubit 100 is associated with both a capacitance 118 and an inductance 120 that are coupled in parallel with the two Josephson junctions 114 provided by the DC-SQUID 104. Ground 122 in the circuit diagram 116 is provided by ground-plane 106. The capacitance and inductance values of the waveguide are determined based on the thin film thickness, width, length, gap spacing to the co-planar ground plane, and substrate. Thus, for a co-planar waveguide flux qubit, such as qubit 100, the capacitance 118 and inductance 120 of the resonator portion of the qubit are provided by waveguide 102, whereas for a persistent current flux qubit, the capacitance and inductance are established using a third Josephson junction within the superconducting loop.

The co-planar waveguide flux qubit design may have several advantages relative to a persistent current flux qubit. For instance, the co-planar waveguide flux qubit may exhibit relatively long decoherence times. Without wishing to be bound by theory, it is believed the improved decoherence time is due, in part, to the co-planar waveguide flux qubit utilizing primarily a single layer of superconducting material to form the flux qubit. By using a single layer of superconducting material on the substrate, sources of decoherence that would otherwise exist due to additional material layers are removed. Similarly, it is believed that the dielectric materials normally used to form the Josephson junctions are also strong sources of decoherence in flux qubits. Thus, by replacing the third Josephson junction in a persistent current flux qubit with the co-planar waveguide, an additional source of decoherence is eliminated, and the decoherence time associated with the qubit can be substantially increased.

In addition, the co-planar waveguide flux qubit allows for coupling to a greater number of qubits. To increase the number of qubits coupled to a typical persistent current flux qubit requires increasing the area of the superconducting loop associated with the qubit. As the area of the loop increases, however, the inductance associated with the qubit rapidly rises, thus potentially limiting the qubit usefulness. Furthermore, a quantum processor may be further limited by the complexity of the so-called embedding problem, given the constraints of a Chimera graph architecture that is typically used when employing persistent current qubits.

Figure 2:
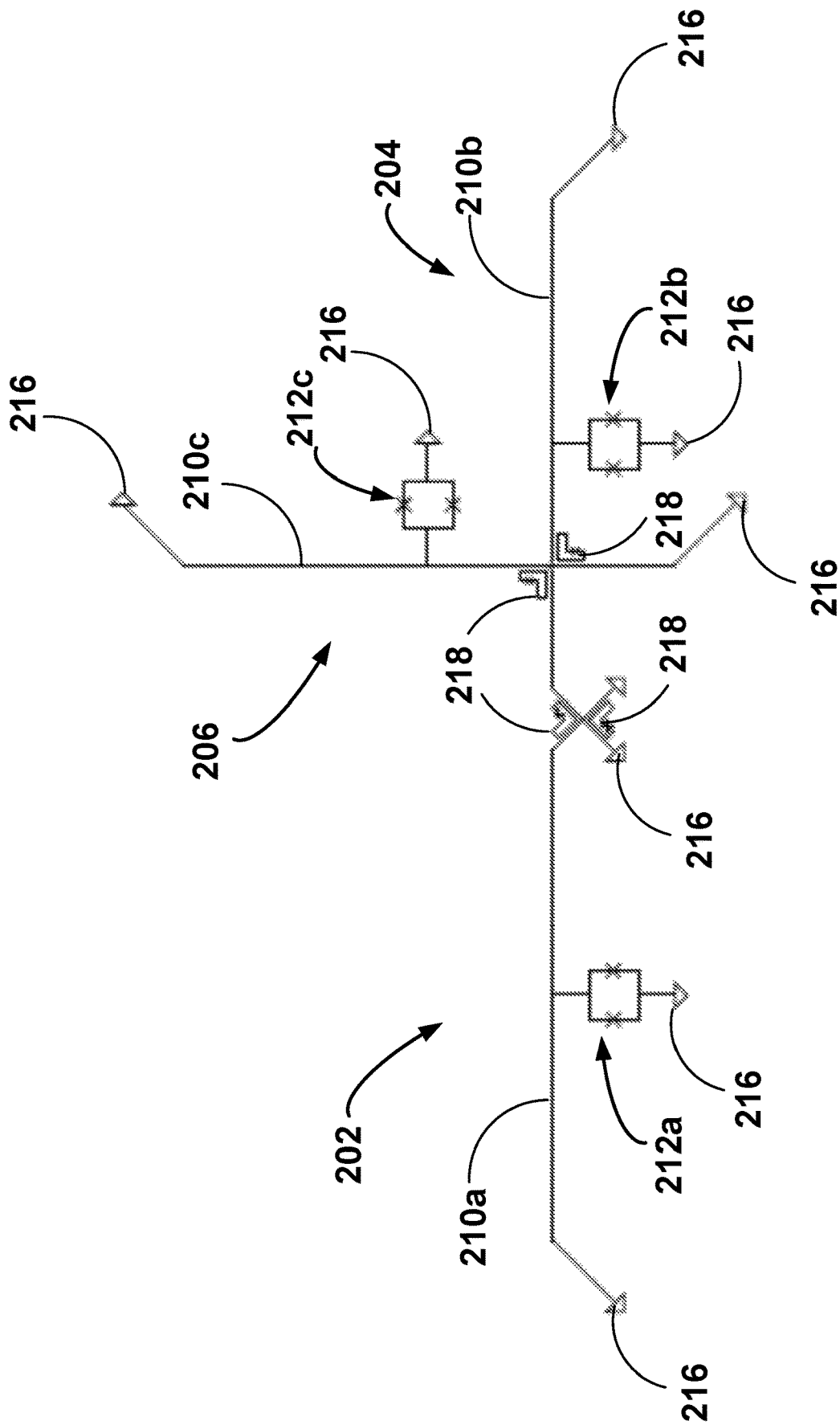
FIG. 2 is a schematic that illustrates examples of two different coupling arrangements that are possible using co-planar waveguide flux qubits.

In contrast, coupling with the co-planar waveguide flux qubit is accomplished through inductive coupling to the co-planar waveguide portion of the qubit. Since the waveguide distributes its inductance and capacitance over a macroscopic length (e.g., several mm), the inductance does not rise as quickly with an increase in wavelength size, and therefore the number of qubits to which one can couple can be substantially increased. Furthermore, the co-planar waveguide can, in some implementations, simplify the embedding problem by establishing more direct pathways between qubits FIG. 2 is a schematic that illustrates examples of two different coupling arrangements that are possible using co-planar waveguide flux qubits. In particular, three different co-planar waveguide flux qubits (202, 204, 206) are illustrated in FIG. 2, in which the first qubit 202 is coupled in an "end-to-end" manner with the second qubit 204, whereas the second qubit 204 is coupled "orthogonal" to the third qubit 206. Though other coupling orientations are also possible, the two arrangements shown in FIG. 2 will be used for a qubit coupling architecture to be described. For ease of viewing, the flux bias lines, other control lines for operating the qubits, and the ground plane are omitted from FIG. 2.

Each qubit (202, 204, or 206) includes a co-planar waveguide (210a, 210b or 210c) coupled to a quantum device (212a, 212b, or 212c) (e.g., a DC-SQUID as shown in FIG. 2). The Josephson junctions of each DC-SQUID are represented by X's in FIG. 2 and are coupled together in parallel. The ends of the co-planar waveguides (210a, 210b, 210c) and the quantum devices (212a, 212b, 212c) are coupled to a ground plane 216. The design of the co-planar waveguide flux qubits are slightly different from the arrangement illustrated in FIGS. 1A-1B. In contrast to the design shown in FIG. 1A, the DC-SQUID of each qubit is electrically coupled to the waveguide at or near a midpoint of the waveguide, whereas the ends of the waveguides are coupled to ground.

In the "end-to-end" arrangement shown in FIG. 2, the first qubit 202 and the second qubit 204 are positioned with respect to one another so that the co-planar waveguide portions 210 of each qubit are aligned to be approximately co-linear. For instance, as shown in FIG. 2, a majority of the waveguide portion 210a of qubit 202 is arranged to be co-linear with a majority of the waveguide portion 210b of qubit 204 along the same horizontal path. In the "orthogonal" arrangement, a majority of the waveguide portion 210b of the second qubit 204 is arranged to be orthogonal with respect to a majority of the waveguide portion 210c of the third qubit 206. In both types of arrangements, the ends of the co-planar waveguides 210 may be bent or deviate along a different direction. The bending of the ends of the co-planar waveguides allows for coupling between the qubits.

Each qubit can be operatively coupled to another qubit through pairs of superconducting couplers 218. That is, during operation of the qubits, the quantum state of a first qubit can be entangled with the quantum state of a second qubit by allowing inductive coupling between the waveguide of the first qubit and the waveguide of the second qubit through a coupler 218. With the placement of a pair of couplers 218, positive or negative coupling between qubits can be achieved by adjusting the flux through each coupler 218. Each coupler 218 includes, for example, a loop of superconducting thin film material (e.g., aluminum), in which a first portion of the loop extends in a first direction along the co-planar waveguide of a first qubit and a second portion of the loop extends in a second direction (e.g., an orthogonal direction) along the co-planar waveguide of a second qubit. For example, the couplers 218 shown in FIG. 2 have a right angle bend where the co-planar waveguides 210a and 210b cross or where the co-planar waveguides 210b and 210c cross. Each coupler 218 is laterally separated from an adjacent waveguide by a thin gap (e.g., on the order of a few microns). Each coupler 218 also is physically separate from the co-planar ground plane. During operation, energy from one waveguide (e.g., 210a) can be inductively coupled to the superconducting thin film coupler 218, which then is inductively coupled to the other waveguide (e.g., waveguide 210b) arranged near the coupler element 218.

Though the co-planar waveguides of adjacent qubits are shown in FIG. 2 as overlapping one another near the coupler pairs, the waveguides are not actually in electrical contact at those crossings. Rather, they are separated from one another using a jumper, such as, e.g., a cross-over air-bridge that allows one of the two waveguides to pass over the other at the crossing without coming into contact. Other designs for enabling the waveguides to cross one another without electrical contact may be used instead.

Figure 3:
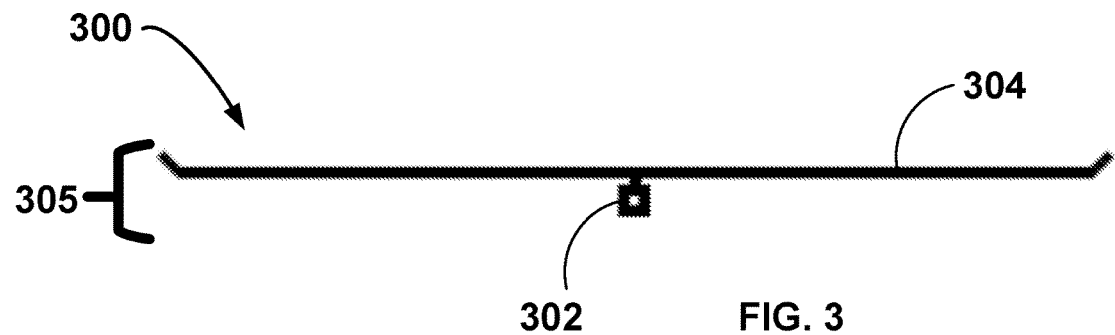
FIG. 3 is a schematic illustrating a simplified representation of a co-planar waveguide flux qubit.

To simplify the drawing of complex qubit coupling architectures, the co-planar waveguide flux qubit may also be represented using the schematic of FIG. 3. The quantum device of the co-planar waveguide flux qubit is replaced in FIG. 3 with a square 302 that is coupled at or near a midpoint of the waveguide 304. The waveguide 304 is illustrated as an elongated line having slight bends at either end. The ground connections and Josephson junctions are omitted for clarity.

Improved Qubit Coupling Architectures

Using superconducting co-planar waveguide flux qubits and the different coupling arrangements shown in FIG. 2, it is possible to construct a scalable quantum processor architectures for long range qubit coupling. Such architectures can offer various advantages. For example, in some implementations, the architectures disclosed herein provide an increase in qubit density. With higher qubit density, a greater range and complexity of problems may be represented and solved. In some implementations, the increase in qubit density can be achieved using a smaller amount of hardware (e.g., couplers) between qubits compared to what would be required with other coupling architectures that achieve the same or less qubit density. With less hardware between qubits, the quantum system can be considered to have a higher conductance or to be less "stiff," i.e., it is easier to transition between different quantum states and there is a lower probability of getting trapped in an undesired state. In some implementations, the increase in density can be achieved by evenly spacing apart the qubits within the coupling architecture. By evenly spacing the qubits, the crosstalk between different qubits is more symmetrical, thus simplifying the calculation and compensation of crosstalk in the system. With reduced computational requirements for calculating and compensating crosstalk, a higher magnitude of crosstalk between can be accommodated, allowing the qubits to be placed closer together. A limit on how close the qubits can be spaced together may be determined by the level of acceptable crosstalk. For instance, in some cases, qubits are spaced too close together such that crosstalk becomes so high, compensating the crosstalk becomes an intractable problem. An example limit for the amount of acceptable crosstalk includes, for example, 1% of the signal from the qubit to be measured. In some implementations, the coupling architectures disclosed herein provide greater interconnectedness between qubits, thus enabling a potentially more computationally powerful quantum computer. A coupling architecture that achieves the foregoing advantages can be understood to have a high treewidth and low diameter.

Furthermore, since the precise number of other qubits that can be coupled to may vary with the computational problem to be solved, it can be advantageous if the quantum processor architecture design provides flexibility in accommodating differing number of qubits. That is, if the quantum processor architecture is scalable, the design then theoretically can be used to solve problems requiring any number of qubits.

An example of a scalable quantum processor architecture capable of coupling to a relatively large number of qubits, having high conductance, high treewidth and low diameter, and a process for producing the same, is set forth as follows. In general, the process can include providing a basic unit cell design that includes two or more overlapping arrays of qubits, in which the qubits of the cell are coupled to one another. The position of the qubits within each array then are shifted by some amount resulting in a modified qubit cell. Depending on the shift applied to each qubit, the modified qubit cell can, in certain implementations, be tiled to form a larger pattern of interconnecting qubits.

Figure 4A:
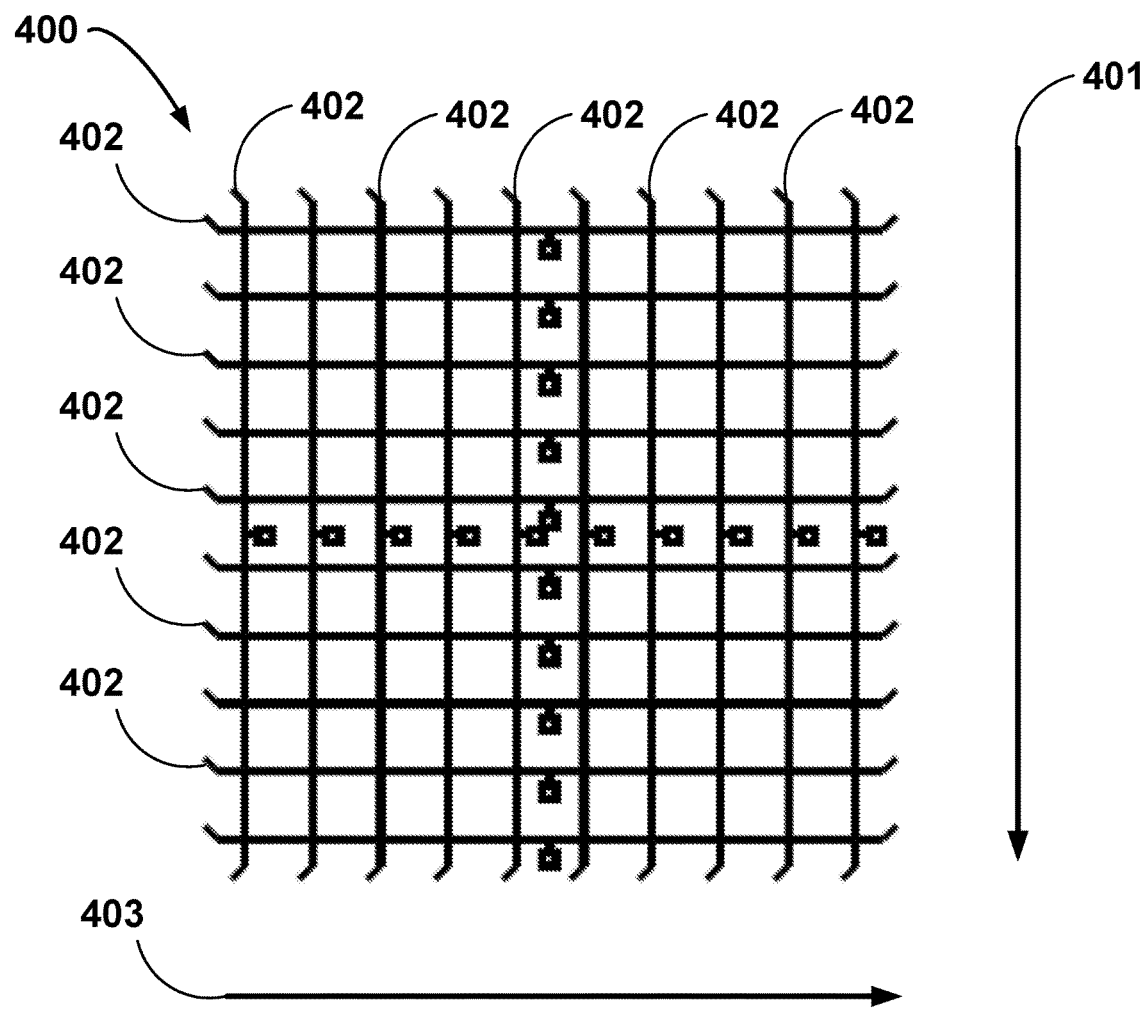
FIG. 4A is a schematic that illustrates an example of a unit cell design in which the qubits of the unit cell are depicted using the simplified co-planar waveguide flux qubit representation shown in FIG. 3.

The first step in constructing the quantum processor architecture includes starting with a basic unit cell that takes into to account the variable number of qubits to which each qubit can couple. FIG. 4A is a schematic that illustrates an example of such a basic unit cell design 400 in which the qubits 402 are depicted using the simplified co-planar waveguide flux qubit representation shown in FIG. 3. The ground plane is omitted for clarity. In the view illustrated in FIG. 4, it is assumed that the qubits are formed and arranged on a substrate (e.g., sapphire, $SiO_2$, or Si). To provide electrical control and operation over the qubits 402, the flux bias lines and other control lines can be formed in a separate layer or layers located above or below the plane in which the qubits 402 are formed. The layer or layers containing the flux bias lines and other control lines can be formed and attached to the qubits 402 using semiconductor fabrication and chip bonding techniques.

The unit cell 400 includes a first array of qubits 402 arranged along a first axis or direction 401, and a second array of qubits 402 arranged along a second axis or direction 403 that is different than the first axis 401 such that the qubits 402 of the two arrays form a lattice structure, in which each intersection of the lattice or crossing point between a co-planar waveguide of a first qubit with the co-planar waveguide of a second different qubit corresponds to a coupling point. In this particular example, the first axis is orthogonal to the second axis, though other arrangements are also possible. Given the orthogonal arrangement of the two arrays, each qubit 402 within the cell 400 couples to multiple other qubits within the cell 400 based on the "orthogonal" coupling as described herein.

Though the waveguides of qubits 402 are shown in FIG. 4A as overlapping one another at the lattice intersections, the waveguides are not actually in electrical contact at those crossings. Rather, they are separated from one another using a jumper such as, e.g., a cross-over air-bridge that allows one of the two waveguides to pass over the other at the crossing without coming into contact. As described with respect to FIG. 2, the waveguides of each qubit are operatively coupled at the crossings using one or more superconducting coupler elements, which are omitted from FIG. 4 for clarity.

Figure 4B:
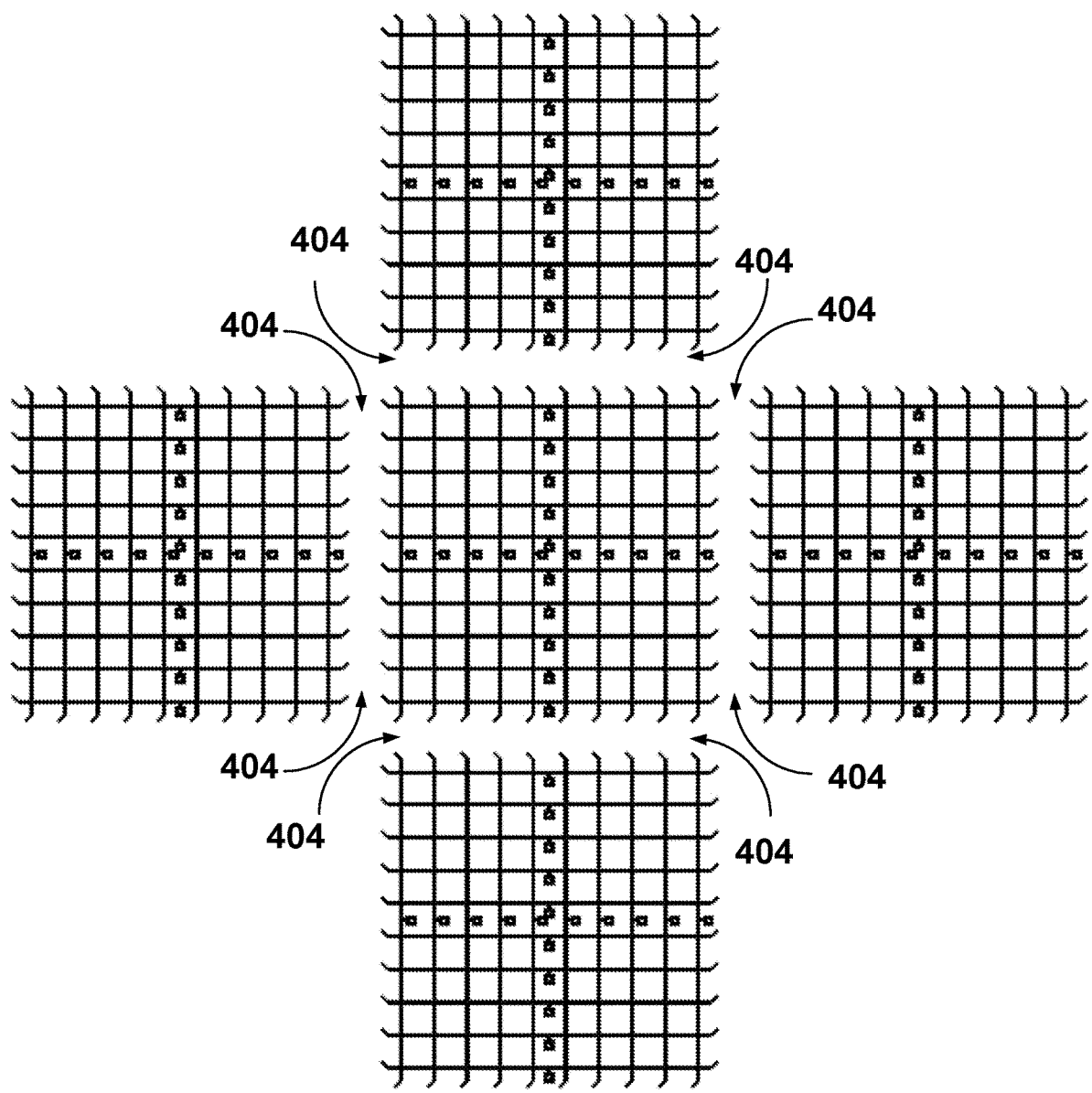
FIG. 4B is a schematic illustrating an example of a tiled arrangement of multiple unit cells of FIG. 4A.

The example unit cell 400 is constructed for c-way coupling, where c=10. That is, a qubit 402 within the cell is arranged to that it can operatively couple directly to 10 other qubits (e.g., other qubits within the cell). However, by tiling the unit cell 400, it is possible to provide, for each qubit of the unit cell 400, direct coupling to two additional qubits through "end-to-end" coupling 404 at the co-planar waveguide's ends, as illustrated in FIG. 4B. For ease of viewing the tiling of unit cells, a gap is illustrated between the ends of the co-planar waveguides at the "end-to-end" coupling locations 404, though it should be understood that the ends from each unit cell can be operatively coupled together, such as shown between qubits 202 and 204 in FIG. 2. Though the unit cell 400 of FIG. 4A is depicted for c-way coupling with c=10, other values for c also may be selected, with the smallest unit cell possible having a c=2.

By tiling the unit cell 400, the resulting quantum processor architecture simply corresponds to a slightly larger version of the Chimera graph (Chimera has the same structure for c=4). That is, a tiled arrangement of unit cells 400 would merely provide fully connected bipartite cells that are weakly connected to their neighboring cells. A given qubit therefore would not be strongly tangled with neighboring qubits in all directions. Furthermore, such a tiled unit cell arrangement would include regions through which one could cut where few couplers exist, denoting relatively poor interconnectedness, and thus a potentially less powerful coupling architecture.

Figure 5:
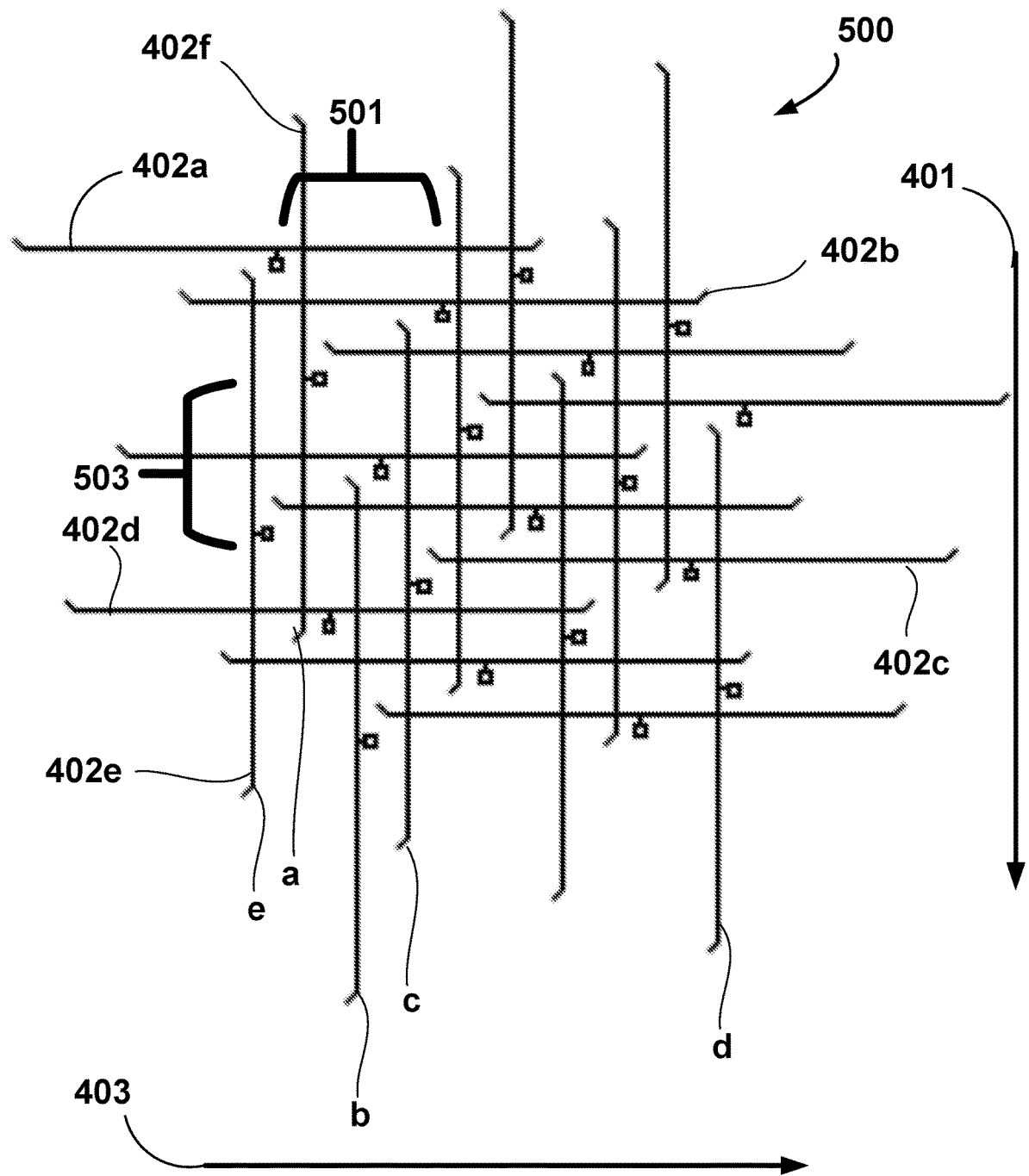
FIG. 5 is a schematic illustrating an example of a modified version of the unit cell of FIG. 4A.

The relative qubit positions are offset both vertically and horizontally from the configuration shown in FIG. 4A to improve the interconnectedness of the unit cells. An example spacing adjustment for 2N qubits arranged in an N×N unit cell 500, with N equal to 10, is shown in FIG. 5 and set forth as follows.

Starting with the first array of qubits 402 (arranged along axis 401) from FIG. 4A, each qubit 402 in the first array is offset along the second axis 403 relative to a directly adjacent qubit 402 in the first array by a first distance that is approximately equal to $\sqrt{N}$ evenly spaced and consecutive qubits oriented in the same direction. For instance, as shown in FIG. 5, qubit 402a in the first array is offset along axis 403 from a directly adjacent qubit 402b in the first array by a distance 501, in which the distance 501 is large enough to accommodate 3 qubits (i.e., approximately $\sqrt{N}$, for N=10). Accordingly, three consecutive qubits from the second array (qubits a, b, and c) that are oriented in the same direction can fit within the offset distance 501 between qubit 402a and 402b. In the present example, the size of a single qubit that is used for determining the offset distance is defined by the width of the co-planar waveguide plus the width of a side of the DC-SQUID (see, e.g., width 305 shown in FIG. 3). However, the qubit size may be defined differently, so long as the qubit size that is defined is used consistently for determining each offset distance.

In order to maintain coupling with the qubits from the second array and to provide a uniform unit cell (so the unit cell can be tiled into a larger structure), the pattern established by offsetting the qubits within the first array can be repeated. The offset 501, however, can be split between the last qubit of the previous pattern and the first qubit of the next pattern. For instance, referring again to FIG. 5, qubit 402c is the last qubit in a pattern of offset qubits, whereas a directly adjacent qubit 402d is the first qubit in a new pattern of offset qubits. However, qubit 402d is not aligned at exactly the same starting position as qubit 402a. Rather, qubit 402d is slightly shifted more to the right in unit cell 500 than is qubit 402a. This is because the offset 501 of approximately $\sqrt{N}$ (e.g., 3 for N=10) has been split between qubit 402c and qubit 402d. In particular, the offset 501 accommodates approximately the width of vertically oriented qubit "d" (located to the right of the DC-SQUID of qubit 402c) and the widths of vertically oriented qubits "e" and "a" (located to the left of the DC-SQUID of qubit 402d).

Once all of the qubits within the first array have been offset according to the design parameters set forth above, the qubits within the second array are offset in a similar manner. For instance, qubit 402e (also identified as qubit "e" in FIG. 5) is offset along the axis 401 from a directly adjacent qubit 402f in the second array by a distance 503, in which the distance 503 is large enough to accommodate 3 qubits (i.e., approximately $\sqrt{N}$, for N=10). Again, to maintain coupling with the qubits from the first array and to provide a uniform unit cell, the pattern established by offsetting the qubits within the second array can be repeated. Furthermore, the offset between directly adjacent qubits within the second array can be split between a last qubit of a previous pattern and a first qubit of a next pattern.

Figure 6:
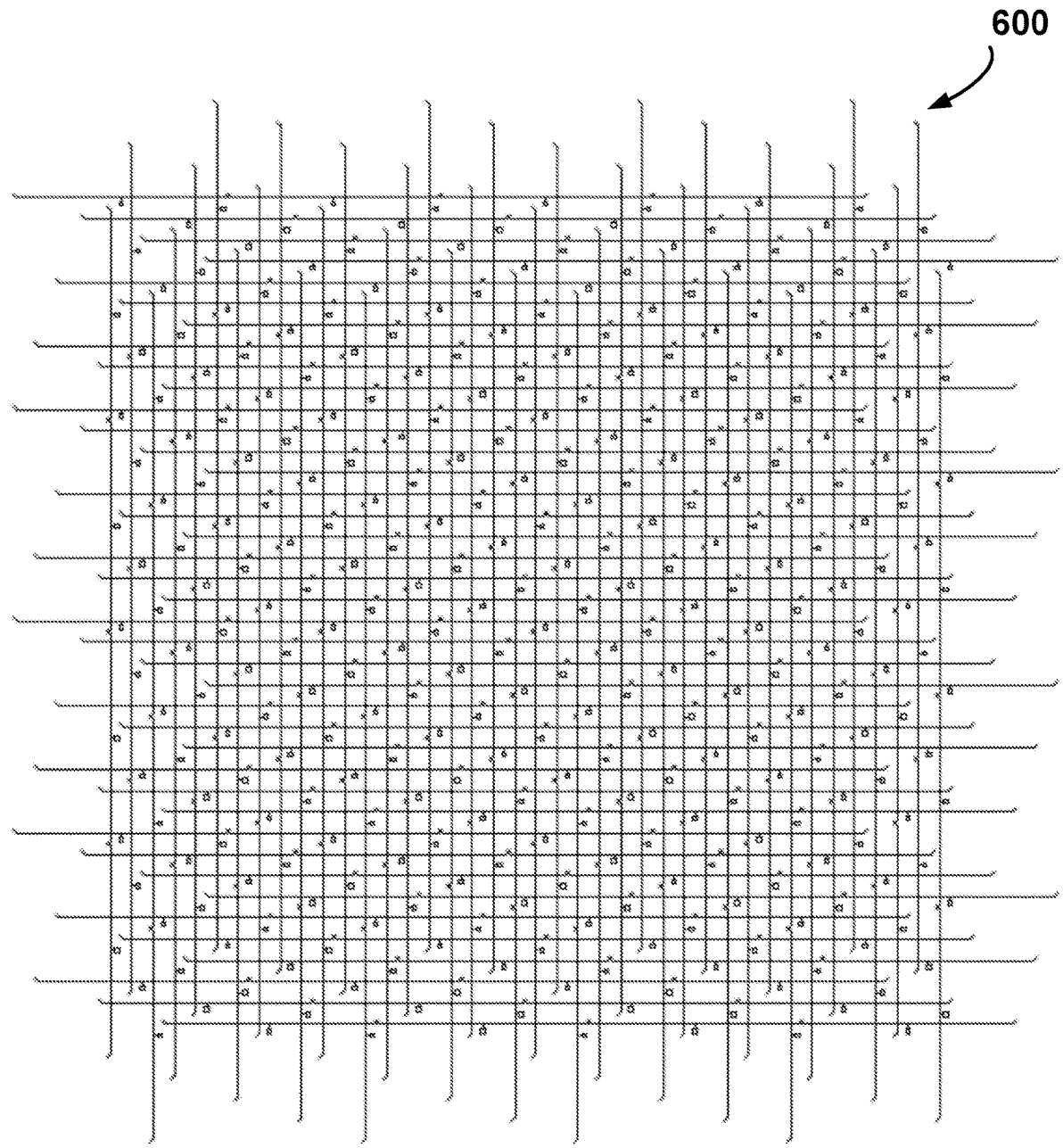
FIG. 6 is a schematic illustrating an example of a tiled arrangement of multiple unit cells of FIG. 5.

After obtaining the modified unit cell 500, in which the qubits have been shifted relative to one another, the modified unit cell 500 can be tiled to create a larger connectivity graph for the purpose of scaling up for systems having large numbers of qubits. The scaling can be achieved thanks, in part, to the uniformity of the unit cell structure 500. A quantum processor architecture 600 composed of 16 unit cells tiled together in a 4×4 super-lattice structure 600 is shown in FIG. 6. The unit cells of the super-lattice structure 600 are constructed using co-planar waveguide flux qubits in the same manner as the unit cell 500 shown in FIG. 5. The tiles are arranged so the qubits of each unit cell can operatively couple to qubits of other adjacent unit cells (e.g., through the placement of inductive couplers at the intersections between waveguides from different unit cells). The qubits positioned adjacent to the outer perimeter of the architecture 600 may couple to fewer qubits than qubits positioned closer to the center of the architecture 600. Additionally, portions of the co-planar waveguides may extend out from the bulk of the lattice 600. To reduce the number of exposed and unused portions of the co-planar waveguides in the tiled lattice, the waveguides can be bent (e.g., bent at a 90° angle) as well as extended so they intersect with and can couple to as many other qubits within the lattice structure 600 as possible.

With the lattice 600, it is possible to rapidly reach other qubits in the lattice starting from any point by following straight horizontal and vertical segments. The unit cells have been constructed such that there is no wasted space. A tiled unit cell structure having a U×U layout of unit cells, in which each unit cell is associated with a c-way coupling, for c greater than or equal to 2 and U greater than or equal to 2, the diameter of the tiled unit cell structure is approximately equal to 2U and the total number of qubits contained within the tiled unit cell is approximately equal to $2U^2c$.

FIGS. 4-6 illustrate one specific type of unit cell and corresponding tiled lattice structure that provide long range qubit coupling. In particular, the qubits of the unit cell design 400 shown in FIG. 4A are arranged in two arrays, in which the elongated portions (e.g., the co-planar waveguide portions) of N qubits in the first array are oriented perpendicular to the elongated portions of N qubits in the second array. However, other unit cell designs are also possible and thus can form the basis for different lattice architectures. For example, in some implementations, the unit cell can include more than two arrays of qubits. In some implementations, the arrays can be oriented at angles other than 90° from one another. Accordingly, a lattice formed by tiling the modified unit cell can also exhibit more than two arrays of qubits oriented along different directions and/or arrays of qubits oriented at angles other than 90° from one another. Alternatively, or in addition, the number of qubits within each array of the unit cell can be different. In some implementations, the distance that each qubit is shifted within an array relative to an adjacent qubit in the array can differ. For example, a first qubit in an array of N qubits can be offset from a parallel and directly adjacent second qubit in the array by approximately $\sqrt{N}$ along a first direction, whereas the second qubit can be offset from a parallel and directly adjacent third qubit in the array by a different amount (e.g., approximately $(\sqrt{N})/2$). Other variations in the offsets between directly adjacent qubits within an array are also possible.

Figure 7:
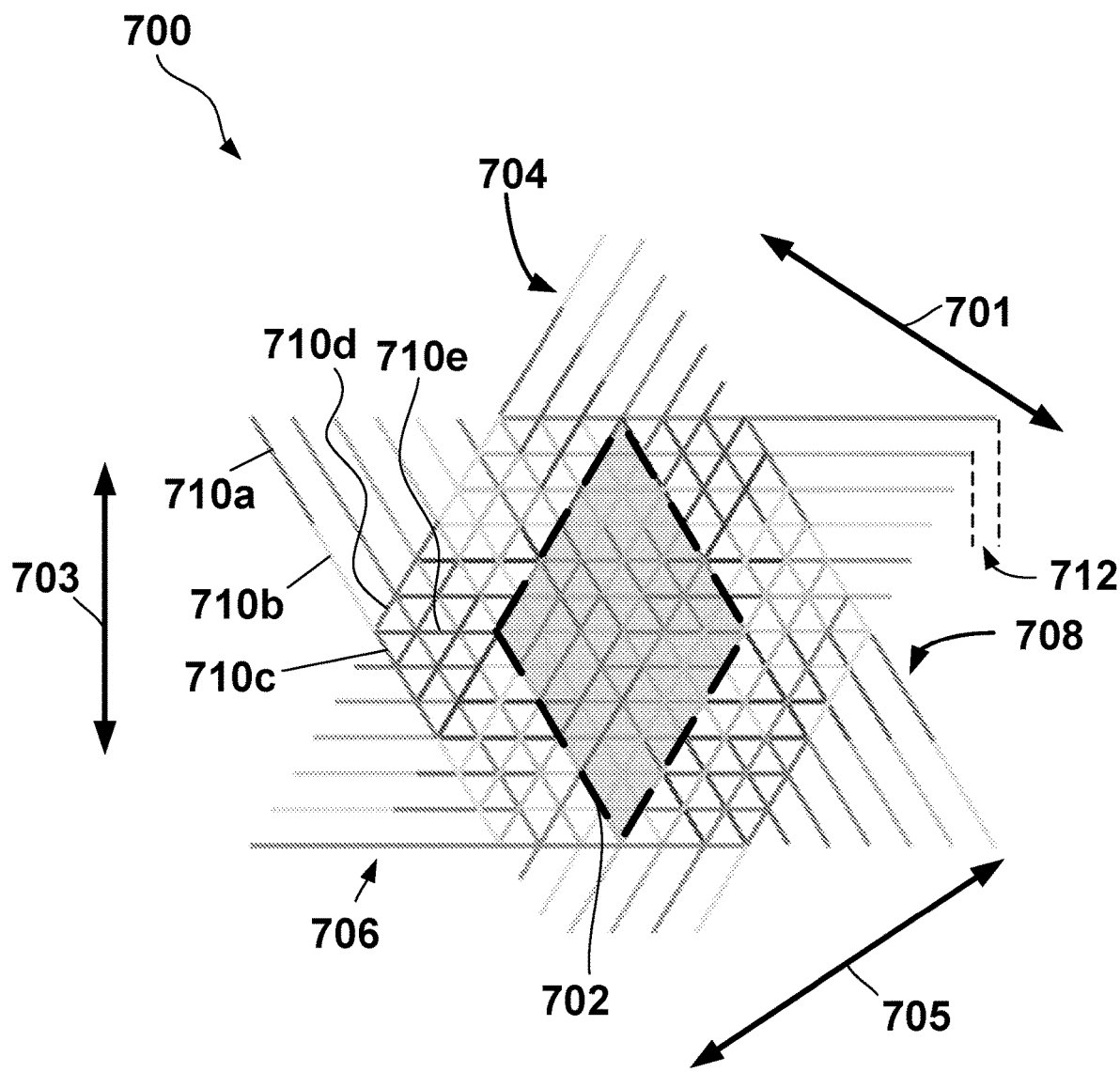
FIGS. 7-8 are schematics illustrating examples of qubit coupling structures.

FIG. 7 is a schematic that illustrates an example of a qubit coupling architecture 700 based on overlapping arrays of qubits arranged to form a diamond-shaped unit cell 702. In the example of FIG. 7, the representation of the qubits is simplified even further for ease of viewing. In particular, each co-planar waveguide flux qubit is simply represented as a grayscale line. The point at which two grayscale lines of different grayscale intensity meet (or where a new pathway direction is established) corresponds to where an inductive coupler can be formed to operatively couple two different qubits together. For example qubit 710a (dark grayscale line) is coupled through an inductive coupler to qubit 710b (light grayscale line), which is coupled to qubit 710c (dark grayscale line). Each of qubits 710b and 710c is also coupled to qubit 710d (dark grayscale line) and qubit 710e (dark grayscale line).

As shown in FIG. 7, the qubit coupling architecture 700 is composed of three separate arrays (704, 706, 708) of qubits oriented along different directions from one another. For instance, architecture 700 includes a first array 704 in which the qubits of the array 704 are spaced apart in parallel along a direction 701. A second array 706 includes qubits spaced apart in parallel along a direction 704, and a third array 708 includes qubits spaced apart in parallel along a direction 706. Each of the angles formed between the different directions (701, 703, 705) is less than 90°. Furthermore, each qubit within each array of the architecture 700 is offset relative to a directly adjacent and parallel qubit within the array by a distance 712. The distance 712 can be variable. As in the modified unit cell shown in FIG. 5, the direction of the offset distance 712 is different from the direction in which the qubits are aligned within the array. The coupling structure shown in FIG. 7 can also be referred to as a triangular connectivity graph since a triangle is formed when qubits from each of the three different qubit arrays overlap one another.

In some implementations, the coupling structures also can include additional long range coupling connections. For instance, in some implementations, one or more resonator lines can be included in the graph architecture, in which each of the one or more resonator lines are coupled to at least two qubits within the coupling architecture. The coupled resonator allows two far away qubits to couple together as one logical qubit. Introducing long range coupling can therefore reduce the diameter of the coupling architecture, increase the conductance, increase the treewidth, and/or increase the spin glass transition temperature.

Figure 8:
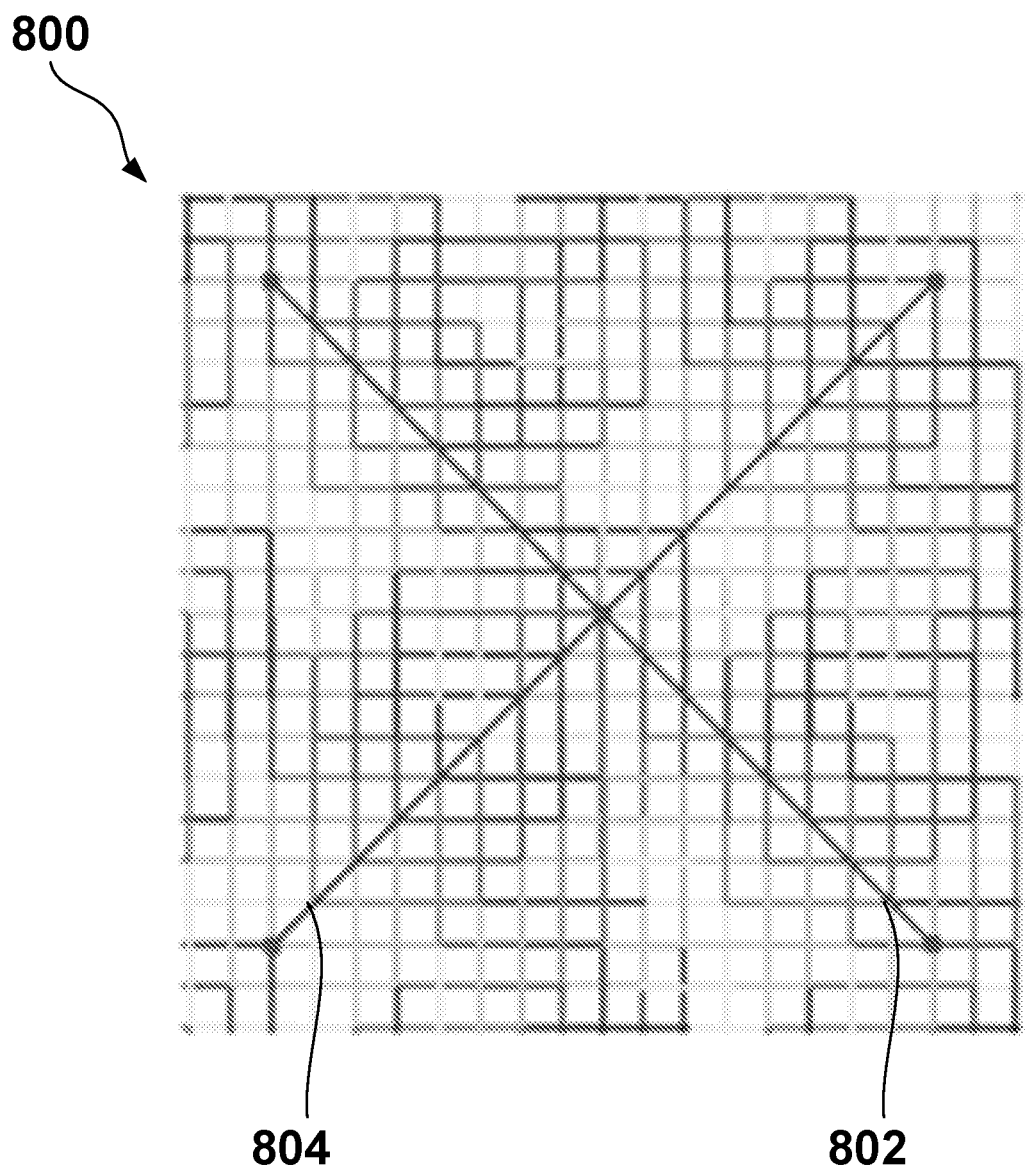

FIG. 8 is a schematic that illustrates an example of a qubit coupling architecture 800 that includes two resonators 802, 804 to provide for long range coupling. Again, for simplicity the co-planar waveguide flux qubits are represented as simple grayscale lines, in which different grayscale intensity corresponds to different qubits. As shown in the example, a first end of the first resonator 802 extends from a coupling point between four qubits near an upper left corner of the coupling graph to a second end at a coupling point between four different qubits near a bottom right corner of the coupling graph 800. Similarly, a first end of second resonator 804 extends from a coupling point between four qubits near an upper right corner of the coupling graph 800 to a second end at a coupling point between four different qubits near a lower left corner of the graph 800. Though the resonators 802 and 804 are shown as crossing, they do not necessarily need to couple at the point of overlap. The resonators 802, 804 can be formed from, e.g., an elongated piece of electrically conductive material, such as superconducting aluminum. Each resonator 802, 804 includes a capacitor at its ends. For instance, at each end of the elongated conductive material, a gap containing, e.g., air or a dielectric may separate a second electrically conducting material such as the superconducting ground plane. In some implementations, the capacitors are not included with the resonator. During operation of a quantum processor that uses the architecture 800, each resonator couples together (e.g., through inductive coupling) one or more qubits at first end to one or more different qubits at a second end of the resonator.

The resonators 802, 804 can be formed in the same plane as the qubits that are locally coupled together within the architecture. To avoid undesired electrical connections with certain qubits, air bridges can be formed at each region where a qubit needs to be overlapped. Alternatively, the resonators can be fabricated so they extend around the perimeter of the architecture 800 to avoid having to form air bridges over qubits. In some implementations, the resonators 802, 804 can be formed in one or more different layers or planes from the qubits to which the resonators connect. For example, using semiconductor 3D integration techniques (e.g., bump bonding and layer stacking), the resonators 802, 804 can be formed layers above or below the layer in which the qubits are formed and coupled to the qubits through vertical interconnects (e.g., vias and/or bump bonds).

The resonators shown in FIG. 8 are not limited to use with the architectures and co-planar waveguide flux qubits disclosed herein; instead, the resonators can be used with any quantum annealer architecture and/or any qubit design. In gate-model quantum computing, quantum buses (long resonators) do this job for applying gates between far apart qubits. Here we discuss general principles behind how the resonators, also referred to as "quantum buses," can be used for long-range coupling in a quantum annealer. The formalism is different from the gate model of quantum computer, as the latter employs a virtual coupling in dispersive regime which is not useful for annealing. Here we need to treat the Hamiltonian in the lab frame as a dispersive transformation that introduces various unwanted system-resonator terms.

Figure 9:
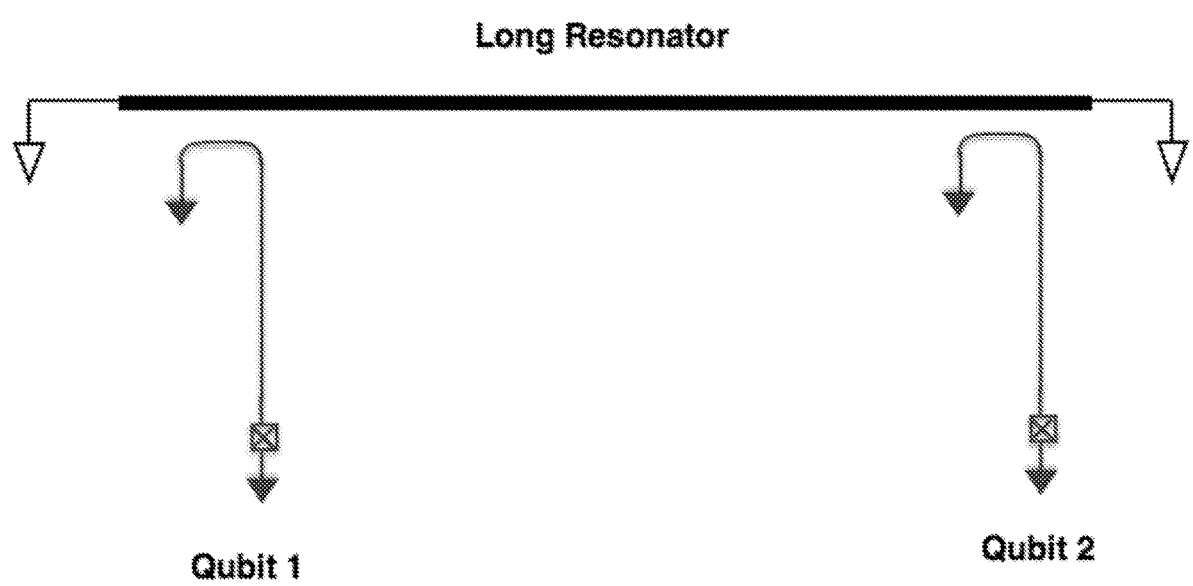
FIG. 9 is a schematic that illustrates an example of a resonator coupled to the main loops of two co-planar waveguide flux qubits.

FIG. 9 is a schematic that illustrates an example of a resonator coupled to the main loops of two co-planar waveguide flux qubits. Again, although co-planar waveguide flux qubits are shown, the resonator can be combined with other qubit designs. The quantum bus is an ancillary system that is supposed to realize an effective ZZ coupling between qubits which means the ground state of the system of qubits plus resonators should be described as the ground state of a Hamiltonian with long-range ZZ terms. We start by writing down the total Hamiltonian of a system of qubits with Ising interaction where two of them are coupled by a single resonator as in FIG. 9:

$$H_{SR} = \sum_{ij} J_{ij} Z_i Z_j + (g_1 Z_1 + g_2 Z_2)(a + a^\dagger) + \omega_r a^\dagger a \qquad (1)$$

where $H_S$ is the Ising Hamiltonian $H_S = \Sigma_i h_i Z_i + \Sigma_{ij} J_{ij} Z_i Z_j$. $g_1$ and $g_2$ are strength of the qubit-resonator couplings and $\omega_r$ is the resonator frequency.

Next we have to construct the proper ground state subspace of this system. Given different values of $Z_1 Z_2 = \uparrow\uparrow, \downarrow\uparrow, \uparrow\downarrow, \downarrow\downarrow$ rewrite the Hamiltonian $$H_{SR} = \sum_i h_i Z_i + \sum_{ij} J_{ij} Z_i Z_j + |\uparrow\uparrow\rangle\langle\uparrow\uparrow|B_{\uparrow\uparrow} + \qquad (2)$$
$$|\uparrow\downarrow\rangle\langle\uparrow\downarrow|B_{\uparrow\downarrow} + |\downarrow\uparrow\rangle\langle\downarrow\uparrow|B_{\downarrow\uparrow} + |\downarrow\downarrow\rangle\langle\downarrow\downarrow|B_{\downarrow\downarrow}$$

with the resonator operators and their diagonal decomposition:

$$B_{\uparrow\uparrow} = (g_1 + g_2)(a + a^\dagger) + \omega_r a^\dagger a = \sum_n E_n^{\uparrow\uparrow} |n\rangle_{\uparrow\uparrow}\langle n|_{\uparrow\uparrow} \qquad (3)$$

$$B_{\uparrow\downarrow} = (g_1 - g_2)(a + a^\dagger) + \omega_r a^\dagger a = \sum_n E_n^{\uparrow\downarrow} |n\rangle_{\uparrow\downarrow}\langle n|_{\uparrow\downarrow} \qquad (4)$$

$$B_{\downarrow\uparrow} = (-g_1 + g_2)(a + a^\dagger) + \omega_r a^\dagger a = \sum_n E_n^{\downarrow\uparrow} |n\rangle_{\downarrow\uparrow}\langle n|_{\downarrow\uparrow} \qquad (5)$$

$$B_{\downarrow\downarrow} = -(g_1 + g_2)(a + a^\dagger) + \omega_r a^\dagger a = \sum_n E_n^{\downarrow\downarrow} |n\rangle_{\downarrow\downarrow}\langle n|_{\downarrow\downarrow} \qquad (6)$$

Figure 10:
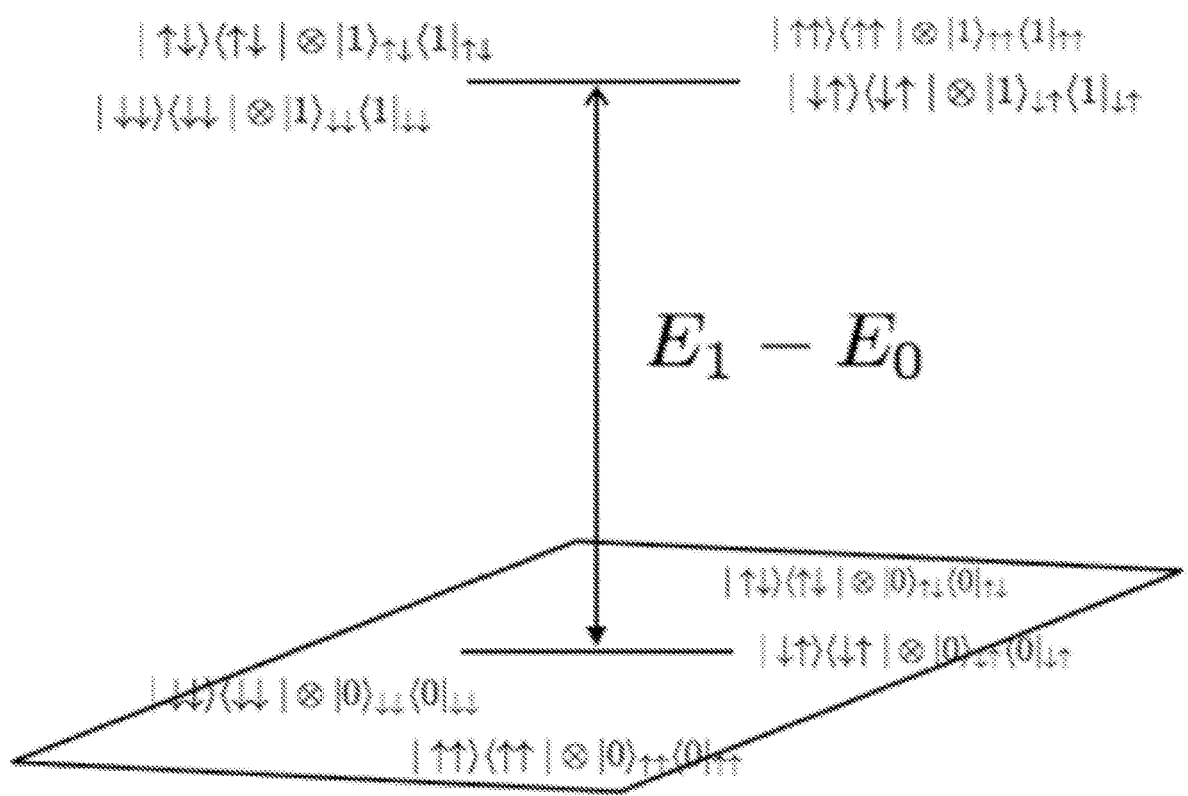
FIG. 10 is a schematic illustrating the energy gap $E_1$-$E_0$.

If we ensure that the ground state subspace of the qubits and resonators are spanned by the lowest energy levels then we obtain an effective ZZ coupling between the qubits $\{|\downarrow\uparrow\rangle\langle\downarrow\uparrow|\otimes|0\rangle_{\downarrow\uparrow}\langle 0|_{\downarrow\uparrow}, |\downarrow\uparrow\rangle\langle\downarrow\uparrow|\otimes|0\rangle_{\downarrow\uparrow}\langle 0|_{\downarrow\uparrow}, |\downarrow\uparrow\rangle\langle\downarrow\uparrow|\otimes|0\rangle_{\downarrow\uparrow}\langle 0|_{\downarrow\uparrow}, |\downarrow\uparrow\rangle, |\downarrow\uparrow\rangle\otimes|0\rangle_{\downarrow\uparrow}\langle 0|_{\downarrow\uparrow}\}$. This can be achieved by having a large energy gap $E_1 - E_0$ as shown in FIG. 10. This energy gap should be chosen larger than the relevant low energy spectrum of the Hamiltonian $\Sigma_i h_i Z_i + \Sigma_{ij} J_{ij} Z_i Z_j$. Under this condition we have the Hamiltonian in the low energy spectrum:

$$H_{SR} = \sum_{ij} J_{ij} Z_i Z_j + \qquad (7)$$
$$E_0^{\uparrow\uparrow} |\uparrow\uparrow\rangle\langle\uparrow\uparrow|\otimes|0\rangle_{\uparrow\uparrow}\langle 0|_{\uparrow\uparrow} + E_0^{\uparrow\downarrow}|\uparrow\downarrow\rangle\langle\uparrow\downarrow|\otimes|0\rangle_{\uparrow\downarrow}\langle 0|_{\uparrow\downarrow} +$$
$$E_0^{\downarrow\uparrow}|\downarrow\uparrow\rangle\langle\downarrow\uparrow|\emptyset|0\rangle_{\downarrow\uparrow}\langle 0|_{\downarrow\uparrow} + E_0^{\downarrow\downarrow}|\downarrow\downarrow\rangle\langle\downarrow\downarrow|\otimes|0\rangle_{\downarrow\downarrow}\langle 0|_{\downarrow\downarrow}$$

and the effective system Hamiltonian would be $$H_{SR} = \sum_{ij} J_{ij} Z_i Z_j + E_0^{\uparrow\uparrow}|\uparrow\uparrow\rangle\langle\uparrow\uparrow| + E_0^{\uparrow\downarrow}|\uparrow\downarrow\rangle\langle\uparrow\downarrow| + E_0^{\downarrow\uparrow}|\downarrow\uparrow\rangle\langle\downarrow\uparrow| + \qquad (8)$$
$$E_0^{\downarrow\downarrow}|\downarrow\downarrow\rangle\langle\downarrow\downarrow|$$
$$= \sum_{ij} J_{ij} Z_i Z_j + \frac{1}{4}(E_0^{\uparrow\uparrow} - E_0^{\uparrow\downarrow} - E_0^{\downarrow\uparrow} + E_0^{\downarrow\downarrow}) Z_1 Z_2 +$$
$$\frac{1}{4}(E_0^{\uparrow\uparrow} - E_0^{\uparrow\downarrow} + E_0^{\downarrow\uparrow} - E_0^{\downarrow\downarrow}) Z_1 + \frac{1}{4}(E_0^{\uparrow\uparrow} + E_0^{\uparrow\downarrow} - E_0^{\downarrow\uparrow} - E_0^{\downarrow\downarrow}) Z_2$$

Programmability: The energy values $E_0$ are functions of $g_1$, $g_2$, and $\omega_r$, then we can have a programmable coefficient for $Z_1 Z_2$ by having tunable resonator frequency and/or qubit-resonator coupling. It is believed that the coupling strength between the resonator and qubits depends on the frequency difference between the qubits and resonator. That is, the smaller this frequency difference is, the stronger the coupling can be. For example, in some implementations, the frequency of a resonator coupled to a first and second qubit can be approximately the same as the frequency of the first qubit and/or of the second qubit to which the resonator couples. The resonator length, in turn, depends in part on the frequency of the resonator. For instance, for a qubit frequency that covers a range of a few GHz to tens of GHz, a resonator with a similar frequency range can have a length of between about 1000 μm to about 15000 μm.

Figure 11:
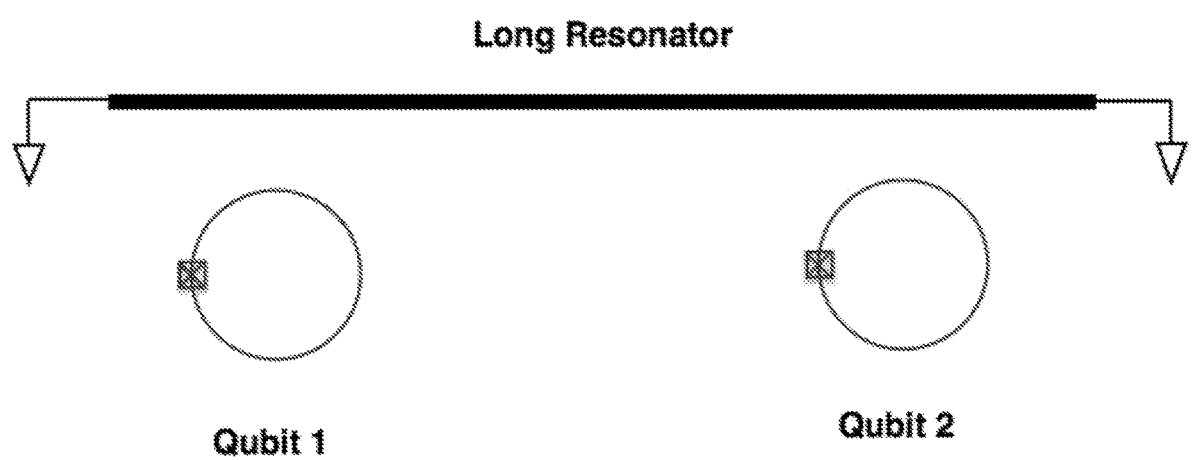
FIG. 11 is a schematic that illustrates a loopy flux qubit coupled inductively to a resonator.
Figure 12:
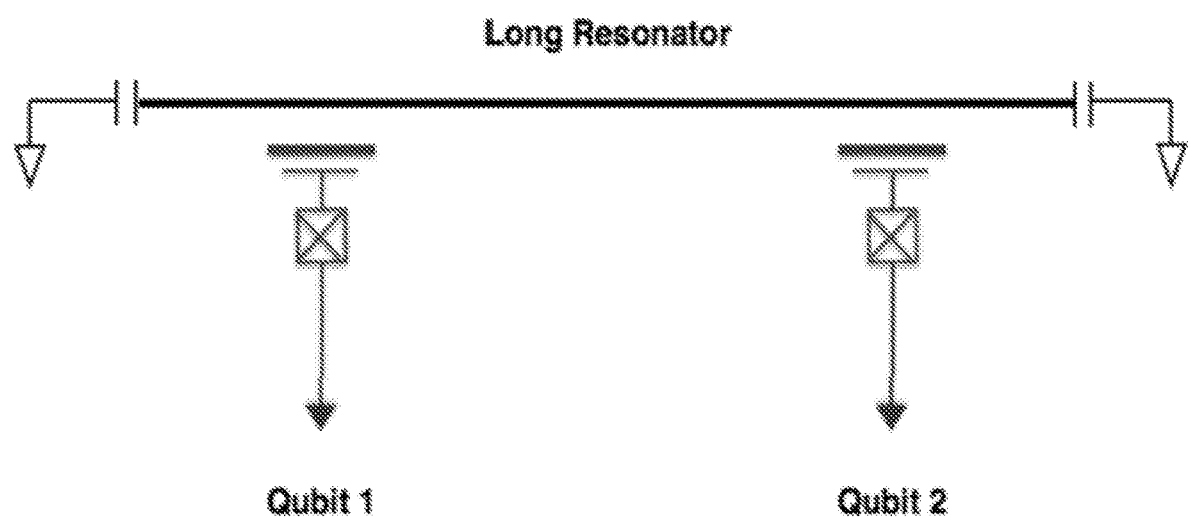
FIG. 12 is a schematic that illustrates a charge qubit using capacitive coupling to a resonator.

FIG. 9 shows inductive coupling between a resonator and co-planar waveguide flux qubits ("fluxmon"). The same principle can be applied to other types of qubits. For instance, FIG. 11 is a schematic that illustrates two loopy flux qubits coupled inductively to the resonator. FIG. 12 is a schematic that illustrates two charge qubits using capacitive coupling to the resonator.

Figure 13:
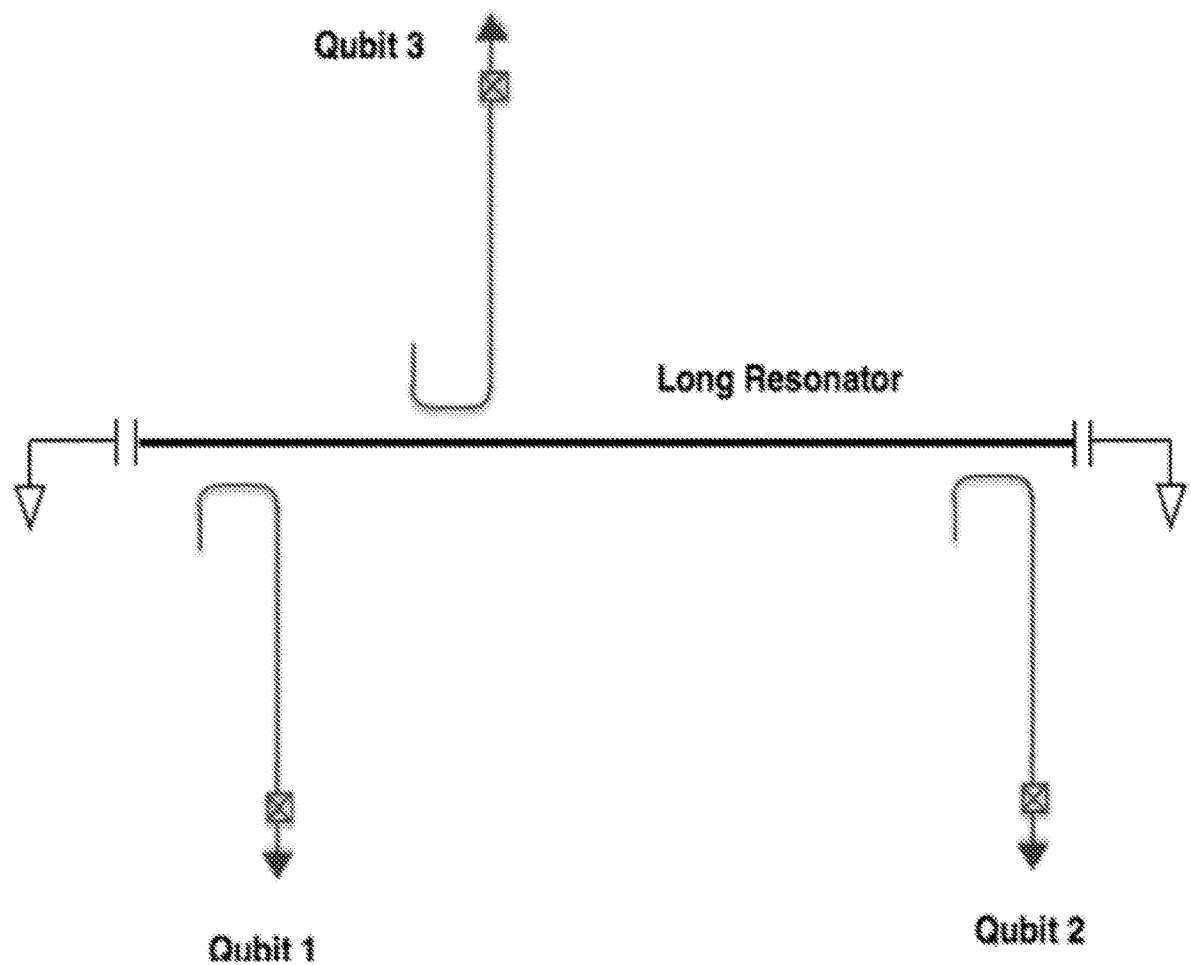
FIG. 13 is a schematic that illustrates a long range resonator coupling together three separate co-planar waveguide flux qubits.

Multi-Qubit Couplings: In quantum annealing having Hamiltonians with multi-qubit terms greatly enhances the programmability of the annealer. Above we showed how to create an effective two-qubit interaction $Z_1 Z_2$. Multi-qubit, e.g., three-qubit ZZZ or four-qubit ZZZZ or, long-range interactions can be implemented by coupling three or more qubits to a single resonator. FIG. 13 is a schematic that illustrates a long range resonator coupling together three separate co-planar waveguide flux qubits.

Embodiments of the digital and quantum subject matter and the digital functional operations and quantum operations described in this specification can be implemented in digital electronic circuitry, suitable quantum circuitry or, more generally, quantum computational systems, in tangibly-embodied digital or quantum computer software or firmware, in digital or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Embodiments of the digital and quantum subject matter described in this specification can be implemented as one or more digital or quantum computer programs, i.e., one or more modules of digital or quantum computer program instructions encoded on a tangible non-transitory storage medium for execution by, or to control the operation of, data processing apparatus. The digital or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital or quantum information, e.g., a machine-generated electrical, optical, or electromagnetic signal, that is generated to encode digital or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. The term "data processing apparatus" refers to digital or quantum data processing hardware and encompasses all kinds of apparatus, devices, and machines for processing digital or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital or quantum computer program can be deployed to be executed on one digital or one quantum computer or on multiple digital or quantum computers that are located at one site or distributed across multiple sites and interconnected by a digital or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital or quantum computers, operating with one or more digital or quantum processors, as appropriate, executing one or more digital or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital or quantum computers.

For a system of one or more digital or quantum computers to be "configured to" perform particular operations or actions means that the system has installed on it software, firmware, hardware, or a combination of them that in operation cause the system to perform the operations or actions. For one or more digital or quantum computer programs to be configured to perform particular operations or actions means that the one or more programs include instructions that, when executed by digital or quantum data processing apparatus, cause the apparatus to perform the operations or actions. A quantum computer may receive instructions from a digital computer that, when executed by the quantum computing apparatus, cause the apparatus to perform the operations or actions.

Digital or quantum computers suitable for the execution of a digital or quantum computer program can be based on general or special purpose digital or quantum processors or both, or any other kind of central digital or quantum processing unit. Generally, a central digital or quantum processing unit will receive instructions and digital or quantum data from a read-only memory, a random access memory, or quantum systems suitable for transmitting quantum data, e.g. photons, or combinations thereof.

The essential elements of a digital or quantum computer are a central processing unit for performing or executing instructions and one or more memory devices for storing instructions and digital or quantum data. The central processing unit and the memory can be supplemented by, or incorporated in, special purpose logic circuitry or quantum simulators. Generally, a digital or quantum computer will also include, or be operatively coupled to receive digital or quantum data from or transfer digital or quantum data to, or both, one or more mass storage devices for storing digital or quantum data, e.g., magnetic, magneto-optical disks, optical disks, or quantum systems suitable for storing quantum information. However, a digital or quantum computer need not have such devices.

Digital or quantum computer-readable media suitable for storing digital or quantum computer program instructions and digital or quantum data include all forms of non-volatile digital or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital or quantum computer program product that includes instructions that are stored on one or more non-transitory machine-readable storage media, and that are executable on one or more digital or quantum processing devices. The systems described in this specification, or portions of them, can each be implemented as an apparatus, method, or system that may include one or more digital or quantum processing devices and memory to store executable instructions to perform the operations described in this specification.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. Various modifications may be made without departing from the spirit and scope of the invention. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

A number of implementations have been described. Nevertheless, it will be understood that various modifications may be made without departing from the spirit and scope of the invention. Other implementations are within the scope of the following claims.

What is claimed is:

1. A quantum computing device comprising:
a first array of qubits arranged along a first axis; and
a second array of qubits arranged along a second axis different from the first axis so that the qubits of the second array intersect with the qubits of the first array to form a lattice structure,
wherein each qubit in the first array is offset along the second axis relative to a directly adjacent qubit in the first array,
each qubit in the second array is offset along the first axis relative to a directly adjacent qubit in the second array, and
each intersection between a qubit from the first array and a qubit from the second array in the lattice structure comprises a coupler arranged to inductively couple the qubit from the first array to the qubit from the second array
wherein each qubit of the lattice structure comprises a co-planar waveguide in direct electrical contact with a superconducting quantum interference device (SQUID), and
wherein, for each co-planar waveguide of each qubit, an end of the co-planar waveguide is in direct electrical contact with ground.

2. The quantum computing device of claim 1, wherein the first array comprises N qubits,
the second array comprises N qubits,
N is greater than or equal to 2,
each qubit in the first array is offset along the second axis relative to a directly adjacent qubit in the first array by a first distance that is approximately equal to N evenly spaced qubits oriented in the same direction, and
each qubit in the second array is offset along the first axis relative to a directly adjacent qubit in the second array by the first distance.

3. The quantum computing device of claim 1, wherein the first axis is orthogonal relative to the second axis.

4. The quantum computing device of claim 1, wherein each intersection between a qubit from the first array and a qubit from the second array in the lattice structure comprises two couplers arranged to inductively couple the qubit from the first array to the qubit from the second array.

5. The quantum computing device of claim 1, wherein the coupler at each intersection between a qubit from the first array and a qubit from the second array is arranged to inductively couple a co-planar waveguide of the qubit from the first array to a co-planar waveguide of the qubit from the second array.

6. The quantum computing device of claim 1, wherein a unit cell is arranged to provide c-way coupling, and c is greater than or equal to 2.

7. The quantum computing device of claim 1, further comprising a third array of qubits arranged along a third axis different from the first axis and the second axis, so that the qubits of the third array intersect with the qubits of the first array and the second array to form the lattice structure.

8. The quantum computing device of claim 1, wherein a first qubit in the first array is offset along the second axis relative to a directly adjacent second qubit in the first array by a first amount, a third qubit in the first array is offset along the second axis relative to a directly adjacent fourth qubit in the first array by a second amount that is different from the first amount.

9. The quantum computing device of claim 1, comprising a plurality of unit cells wherein each unit cell of the plurality of unit cells respectively comprises:
   a first array of qubits arranged along a first axis; and
   a second array of qubits arranged along a second axis different from the first axis so that the qubits of the second array intersect with the qubits of the first array to form a lattice structure,
   wherein each qubit in the first array is offset along the second axis relative to a directly adjacent qubit in the first array,
   each qubit in the second array is offset along the first axis relative to a directly adjacent qubit in the second array, and
   each intersection between a qubit from the first array and a qubit from the second array in the lattice structure comprises a coupler arranged to inductively couple the qubit from the first array to the qubit from the second array, and
   wherein the plurality of unit cells are tiled such that each unit cell of the plurality of unit cells is operatively coupled to a neighboring unit cell,
   wherein each qubit of each unit cell comprises a co-planar waveguide electrically in direct electrical contact with a superconducting quantum interference device (SQUID), and
   wherein, for each co-planar waveguide of each qubit, an end of the co-planar waveguide is in direct electrical contact with ground.

10. The quantum computing device of claim 9, wherein, for each unit cell of the plurality of unit cells,
   the first array of the unit cell comprises N qubits, the second array of the unit cell comprises N qubits, N is greater than or equal to 2,
   each qubit in the first array of the unit cell is offset along the second axis relative to a directly adjacent qubit in the first array by a first distance that is approximately equal to N evenly spaced qubits oriented in the same direction, and
   each qubit in the second array of the unit cell is offset along the first axis relative to a directly adjacent qubit in the second array by the first distance.

11. The quantum computing device of claim 9, wherein, for each unit cell of the plurality of unit cells, the first axis is orthogonal relative to the second axis.

12. The quantum computing device of claim 9, wherein, for each unit cell of the plurality of unit cells, each intersection between a qubit from the first array and a qubit from the second array in the lattice structure comprises two couplers arranged to inductively couple the qubit from the first array to the qubit from the second array.

13. The quantum computing device of claim 9, wherein, for each unit cell of the plurality of unit cells, the coupler at each intersection between a qubit from the first array and a qubit from the second array is arranged to inductively couple a co-planar waveguide of the qubit from the first array to a co-planar waveguide of the qubit from the second array.

14. The quantum computing device of claim 9, wherein the plurality of unit cells are tiled such that, for each unit cell of the plurality of unit cells, at least one co-planar waveguide from a qubit of the unit cell is coupled to at least one other co-planar waveguide from a qubit of a different unit cell.

15. The quantum computing device of claim 9, wherein the tiles are arranged along a grid of U rows and U columns, and U is greater than or equal to 2.

16. The quantum computing device of claim 15, wherein the grid has a diameter of 2U.

17. The quantum computing device of claim 16, wherein each unit cell of the plurality of unit cells is arranged to provide c-way coupling, and c is greater than or equal to 2.

18. The quantum computing device of claim 17, wherein the plurality of unit cells comprises approximately $2U^2c$ qubits.

19. The quantum computing device of claim 18, comprising a resonator, wherein a first end of the resonator is coupled to a first qubit and a second end of the resonator is coupled to a second qubit different from the first qubit.

* * * * *